US011227964B2

(12) United States Patent
Needell et al.

(10) Patent No.: US 11,227,964 B2
(45) Date of Patent: Jan. 18, 2022

(54) LUMINESCENT SOLAR CONCENTRATORS AND RELATED METHODS OF MANUFACTURING

(71) Applicants: California Institute of Technology, Pasadena, CA (US); The Regents of the University of California, Oakland, CA (US); The Board of Trustees of the University of Illinois, Urbana, IL (US)

(72) Inventors: David R. Needell, Pasadena, CA (US); Noah Bronstein, Golden, CO (US); Armand P. Alivisatos, Berkeley, CA (US); Harry A. Atwater, South Pasadena, CA (US); Ralph Nuzzo, Champaign, IL (US); Haley Bauser, Pasadena, CA (US); Ognjen Ilic, Minneapolis, MN (US); Junwen He, Urbana, IL (US); Lu Xu, Santa Clara, CA (US); Colton Bukowsky, Pasadena, CA (US); Sunita Darbe, Pasadena, CA (US); Zach Nett, San Francisco, CA (US); Brent Koscher, Somerville, MA (US)

(73) Assignees: California Institute of Technology, Pasadena, CA (US); The Regents of the University of California, Oakland, CA (US); The Board of Trustees of the University of Illinois, Urbana, IL (US)

( * ) Notice: Subject to any disclaimer, the term of this patent is extended or adjusted under 35 U.S.C. 154(b) by 19 days.

(21) Appl. No.: 16/113,844

(22) Filed: Aug. 27, 2018

(65) Prior Publication Data
US 2019/0067504 A1      Feb. 28, 2019

Related U.S. Application Data

(60) Provisional application No. 62/550,115, filed on Aug. 25, 2017.

(51) Int. Cl.
*H01L 31/055*      (2014.01)
*H01L 31/0693*      (2012.01)
(Continued)

(52) U.S. Cl.
CPC ...... *H01L 31/055* (2013.01); *H01L 31/02165* (2013.01); *H01L 31/02168* (2013.01);
(Continued)

(58) Field of Classification Search
CPC ............. H01L 31/055; H01L 31/02165; H01L 31/0684; H01L 31/0693
See application file for complete search history.

(56) References Cited

U.S. PATENT DOCUMENTS

| 3,278,811 A | 10/1966 | Hiroshi |
| 4,621,898 A | 11/1986 | Cohen |

(Continued)

FOREIGN PATENT DOCUMENTS

| CN | 101598717 A | 12/2009 |
| WO | 2016111576 A1 | 7/2016 |

(Continued)

OTHER PUBLICATIONS

Gutmann et al., "Predicting the performance of photonic luminescent solar concentrators", IEEE Photovoltaic Specialists Conference, Jun. 16-21, 2013, pp. 1864-1868.
(Continued)

*Primary Examiner* — Tae-Sik Kang
(74) *Attorney, Agent, or Firm* — KPPB LLP

(57) ABSTRACT

Luminescent solar concentrators in accordance with various embodiments of the invention can be designed to minimize
(Continued)

photon thermalization losses and incomplete light trapping using various components and techniques. Cadmium selenide core, cadmium sulfide shell (CdSe/CdS) quantum dot ("QD") technology can be implemented in such devices to allow for near-unity QDs and sufficiently large Stokes shifts. Many embodiments of the invention include a luminescent solar concentrator that incorporates CdSe/CdS quantum dot luminophores. In further embodiments, anisotropic luminophore emission can be implemented through metasurface/plasmonic antenna coupling. In several embodiments, red-shifted luminophores are implemented. Additionally, top and bottom spectrally-selective filters, such as but not limited to selectively-reflective metasurface mirrors and polymeric stack filters, can be implemented to enhance the photon collection efficiency. In some embodiments, luminescent solar concentrator component is optically connected in tandem with a planar Si subcell, forming a micro-optical tandem luminescent solar concentrator.

18 Claims, 11 Drawing Sheets

(51) Int. Cl.
H01L 31/068 (2012.01)
H01L 31/0216 (2014.01)
H01L 31/048 (2014.01)
H01L 31/054 (2014.01)
H01L 31/056 (2014.01)

(52) U.S. Cl.
CPC .......... H01L 31/048 (2013.01); H01L 31/056 (2014.12); H01L 31/0547 (2014.12); H01L 31/0684 (2013.01); H01L 31/0693 (2013.01)

(56) References Cited

U.S. PATENT DOCUMENTS

| 5,075,262 | A | 12/1991 | Nguyen et al. |
| 5,076,857 | A | 12/1991 | Nowlan |
| 5,122,215 | A | 6/1992 | Shibata et al. |
| 5,554,229 | A | 9/1996 | Vogeli |
| 6,473,220 | B1 | 10/2002 | Clikeman et al. |
| 6,573,445 | B1 | 6/2003 | Burgers |
| 6,768,048 | B2 | 7/2004 | Woll et al. |
| 7,573,550 | B2 | 8/2009 | Lubart et al. |
| 7,595,934 | B2 | 9/2009 | Lubart et al. |
| 8,202,566 | B2 | 6/2012 | Davidson et al. |
| 8,648,248 | B2 | 2/2014 | Rodriguez-parada et al. |
| 9,267,889 | B1* | 2/2016 | Klopfer .............. G01N 21/6428 |
| 9,750,141 | B2 | 8/2017 | Noy |
| 11,041,338 | B2 | 6/2021 | Saive et al. |
| 2003/0041894 | A1 | 3/2003 | Sverdrup, Jr. et al. |
| 2005/0109388 | A1 | 5/2005 | Murakami et al. |
| 2006/0283498 | A1 | 12/2006 | Gronet |
| 2007/0281099 | A1 | 12/2007 | Howarth et al. |
| 2008/0176030 | A1 | 7/2008 | Fonash et al. |
| 2008/0271776 | A1 | 11/2008 | Morgan |
| 2009/0061213 | A1 | 3/2009 | Bahnmuller et al. |
| 2009/0078303 | A1 | 3/2009 | Brezoczky et al. |
| 2009/0151782 | A1 | 6/2009 | Ko et al. |
| 2009/0221111 | A1 | 9/2009 | Frolov et al. |
| 2009/0229667 | A1 | 9/2009 | Shrotriya et al. |
| 2009/0255568 | A1 | 10/2009 | Morgan |
| 2010/0075261 | A1 | 3/2010 | Clevenger et al. |
| 2010/0089262 | A1 | 4/2010 | Seong et al. |
| 2010/0116316 | A1 | 5/2010 | Moslehi et al. |
| 2010/0139749 | A1* | 6/2010 | Mapel ................ H01L 31/0547 136/255 |
| 2011/0226332 | A1 | 9/2011 | Ford et al. |
| 2012/0031486 | A1 | 2/2012 | Parce et al. |
| 2012/0067400 | A1 | 3/2012 | Derryberry et al. |
| 2012/0067402 | A1 | 3/2012 | Kitai et al. |
| 2012/0132278 | A1 | 5/2012 | Winston et al. |
| 2012/0229907 | A1 | 9/2012 | Ueda et al. |
| 2013/0074918 | A1 | 3/2013 | Jeong et al. |
| 2013/0125974 | A1 | 5/2013 | Kong et al. |
| 2013/0210185 | A1 | 8/2013 | Yoshimi et al. |
| 2014/0000692 | A1 | 1/2014 | Fogel et al. |
| 2014/0130864 | A1 | 5/2014 | Lunt et al. |
| 2014/0154769 | A1 | 6/2014 | Del Ninno et al. |
| 2015/0200320 | A1 | 7/2015 | Martorell et al. |
| 2015/0311370 | A1 | 10/2015 | Chou et al. |
| 2016/0087135 | A1 | 3/2016 | Horimai et al. |
| 2016/0302305 | A1 | 10/2016 | Chang et al. |
| 2016/0313640 | A1 | 10/2016 | Cok et al. |
| 2016/0322514 | A1 | 11/2016 | Atwater et al. |
| 2017/0038047 | A1 | 2/2017 | Golle et al. |
| 2017/0179041 | A1 | 6/2017 | Dias et al. |
| 2017/0263796 | A1 | 9/2017 | Jahelka |
| 2018/0248064 | A1 | 8/2018 | Lunt et al. |
| 2018/0337297 | A1 | 11/2018 | Murofushi et al. |
| 2019/0074401 | A1 | 3/2019 | Saive et al. |
| 2019/0148574 | A1 | 5/2019 | Saive et al. |
| 2019/0326460 | A1 | 10/2019 | Needell et al. |
| 2020/0028005 | A1 | 1/2020 | Saive et al. |
| 2020/0063487 | A1 | 2/2020 | Saive et al. |
| 2020/0241186 | A1 | 7/2020 | Ohta et al. |

FOREIGN PATENT DOCUMENTS

| WO | 2019035094 A1 | 2/2019 |
| WO | 2019099733 A1 | 5/2019 |
| WO | 2019139996 A1 | 7/2019 |

OTHER PUBLICATIONS

Hansen et al., "Analysis of Irradiance Models for Bifacial PV Modules", IEEE 43rd Photovoltaic Specialists Conference (PVSC), Portland, Oregon, Jun. 5-10, 2016, 6 pgs.
Henry, "ICP etching of silicon for micro and nanoscale devices", Thesis, California Institute of Technology, May 19, 2010, 219 pgs., (presented in two parts).
Henry et al., "Alumina etch masks for fabrication of high-aspect-ratio silicon micropillars and nanopillars", Nanotechnology, Jun. 2, 2009, vol. 20, 255305, 4 pgs.
Herasimenka et al., "750 mV open circuit voltage measured on 50 μm thick silicon heterojunction solar cell", Applied Physics Letters, Aug. 1, 2013, vol. 103, pp. 053511-1-053511-4.
Hinkle et al., "Detection of Ga suboxides and their impact on III-V passivation and Fermi-level pinning", Applied Physics Letters, Apr. 20, 2009, vol. 94, No. 16, pp. 162101-1-162101-3, doi: 10.1063/1.3120546.
Holman et al., "Current losses at the front of silicon heterojunction solar cells", IEEE Journal of Photovoltaics, Jan. 2012, vol. 2, No. 1, pp. 7-15.
Honsberg et al., PVCDROM, http://pveducation.org/pvcdrom, Jan. 5, 2015, 1 pg.
Horzel et al., "Advantages of a new metallisation structure for the front side of solar cells", 13th European Photovoltaic Solar Energy Conference, Oct. 23-27, 1995, pp. 1368-1373.
Hoye et al., "Strongly Enhanced Photovoltaic Performance and Defect Physics of Air-Stable Bismuth Oxyiodide (BiOI)", Advanced Materials, Jul. 17, 2017, vol. 29, No. 36, 1702176, 10 pgs., doi: 10.1002/adma.201702176.
Hsu et al., "Performance enhancement of metal nanowire transparent conducting electrodes by mesoscale metal wires", Nature Communications, Sep. 25, 2013, vol. 4, No. 2522, pp. 1-7.
Hu et al., "Ray-trace simulation of CuInS(Se)_2 quantum dot based luminescent solar concentrators", Optics Express, vol. 23, No. 15, Jul. 27, 2015, pp. A858-A867.
Huang et al., "Fabrication of Silicon Nanowire Arrays with Controlled Diameter, Length, and Density", Advanced Materials, Feb. 7, 2007, vol. 19, No. 5, pp. 744-748, doi: 10.1002/adma.200600892.
Jasieniak et al., "Re-examination of the Size-Dependent Absorption Properties of CdSe Quantum Dots", Journal of Physical Chemistry, vol. 113, No. 45, Oct. 15, 2009, pp. 19468-19474.

(56) References Cited

OTHER PUBLICATIONS

Jiang et al., "Enhanced electron extraction using SnO2 for high efficiency planar-structure HC(NH2)2PbI3-based perovskite solar cells", Nature Energy, Nov. 14, 2016, vol. 2, Issue 16177, 7 pgs., doi: 10.1038/nenergy.2016.177.
Kelzenberg, "Silicon microwire photovoltaics", Thesis, California Institute of Technology, May 19, 2010, 324 pgs., (presented in two parts).
Kik et al., "Catoptric electrodes: transparent metal electrodes using shaped surfaces", Optics Letters, vol. 39, No. 17, Sep. 1, 2014, pp. 5114-5117, http://dx.doi.org/10.1364/OL39.005114.
King, "Photovoltaic Module and Array Performance Characterization Methods for All System Operating Conditions", AIP Conference Proceedings, vol. 394, No. 1, May 12, 2008, 22 pgs.
Klein et al., "Transparent Conductive Adhesives for Tandem Solar Cells Using Polymer-Particle Composites", ACS Applied Materials & Interfaces, 2008, No. 10, pp. 8086-8091.
Kopecek et al., "Bifaciality: One small step for technology, one giant leap for kWh cost reduction", Photovoltaics International, vol. 26, 2014, 11 pgs.
Kreinin et al., "PV systems based on bifacial modules: Performance simulation vs. design factors", IEEE 43rd Photovoltaic Specialists Conference (PVSC), Portland, Oregon, Jun. 5-10, 2016, pp. 2688-2691.
Krenzinger et al., "Estimation of Radiation Incident on Bifacial Albedo-Collecting Panels", International Journal of Solar Energy, vol. 4, No. 5, 1986, pp. 297-319.
Kuang et al., "A New Architecture for Transparent Electrodes: Relieving the Trade-Off Between Electrical Conductivity and Optical Transmittance", Advanced Materials, No. 23, 2011, pp. 2469-2473.
Lai et al., "Schottky Barrier Catalysis Mechanism in Metal-Assisted Chemical Etching of Silicon", ACS Applied Materials & Interfaces, Mar. 28, 2016, vol. 8, No. 14, pp. 8875-8879. doi: 10.1021/acsami.6b01020.
Levy et al., "Rapid and precise calculations of energy and particle flux for detailed-balance photovoltaic applications", Solid-State Electronics, vol. 50, No. 7-8, Jul.-Aug. 2006, pp. 1400-1405.
Lo et al., "New integrated simulation tool for the optimum design of bifacial solar panel with reflectors on a specific site", Renewable Energy, vol. 81, Sep. 2015, pp. 293-307.
Lohmüller et al., "The HIP-MWT+ solar cell concept on n-type silicon and metallization-induced voltage losses", 29th European PV Solar Energy Conference and Exhibition, Amsterdam, The Netherlands, Sep. 22-26, 2014, 7 pgs.
Lossen et al., "Double Printing nPERT Cells with Narrow Contact Layers", Energy Procedia, vol. 92, Aug. 2016, pp. 939-948.
Ma et al., "Enhancement of photovoltaic cell response due to high-refractive-index encapsulants", Journal of Applied Physics, Aug. 18, 2010, vol. 108, pp. 043102-1-043102-3, http://www.ecse.rpiscrews.us/~schubert/Reprints/2010-Ma-Ming-et-al-%28JAP%29-Enhancement-of-photovoltaic-cell-response-due-to-high-refractive-index-encapsulants.pdf.
Madrid et al., "Investigation of the Efficiency Boost Due to Spectral Concentration in a Quantum-Dot Based Luminescent Concentrator", IEEE World Conference on Photovoltaic Energy Conference, May 7-12, 2006, pp. 154-157.
Martinez et al., "Design, fabrication, and characterization of a luminescent solar concentrator with optimized optical concentration through minimization of optical losses", Journal of Photonics for Energy, vol. 6, No. 4, Nov. 30, 2016, pp. 045504-1-045501-11.
Masuko et al., "Achievement of more than 25% conversion efficiency with crystalline silicon heterojunction solar cell", IEEE Journal of Photovoltaics, Nov. 2014, vol. 4, pp. 1433-1435.
McIntosh et al., "OPAL 2: Rapid Optical Simulation of Silicon Solar Cells", 38th IEEE Photovoltaic Specialists Conference, Austin, Texas, Jun. 3-8, 2012, 8 pgs.
Meinardi et al., "Highly efficient luminescent solar concentrators based on earth-abundant indirect-bandgap silicon quantum dots", Nature Photonics, vol. 1, No. 3, Mar. 1, 2017, pp. 177-185.
Meinardi et al., "Large-area luminescent solar concentrators based on 'Stokes-shift-engineered' nanocrystals in a mass-polymerized PMMA matrix", Nature Photonics, vol. 8, No. 5, Apr. 13, 2014, pp. 392-399.
Mittag et al., "Triangular Ribbons for Improved Module Efficiency", 32nd European PV Solar Energy Conference and Exhibition, Jun. 20-24, 2016, Munich, Germany, 4 pgs.
Morales-Masis et al, "Transparent electrodes for efficient optoelectronics", Advanced Electronic Materials 3, No. 5 (2017): 1600529.
Narasimhan et al., "Hybrid Metal-Semiconductor Nanostructure for Ultrahigh Optical Absorption and Low Electrical Resistance at Optoelectronic Interfaces", ACS Nano, vol. 9, No. 11, Oct. 8, 2015, pp. 10590-10597.
Needell et al., "Micro-optical Tandem Luminescent Solar Concentrators", arXiv:1710.00034v1, Sep. 5, 2017, 10 pgs.
Niu et al, "High order diffraction suppression by quasi-periodic two-dimensional gratings", Optical Materials Express, Feb. 1, 2017, vol. 7, No. 2, pp. 366-375, doi: 10.1364/OME.7.000366.
Padmanabhan et al., "Light-induced degradation and regeneration of multicrystalline silicon AI-BSF and PERC solar cells", Physica Status Solidi: Rapid Research Letters, vol. 10, No. 12, Dec. 2016, Online Publication: Nov. 16, 2016, pp. 874-881.
Papakonstantinou et al., "Fundamental limits of concentration in luminescent solar concentrators revised: the effect of reabsorption and nonunity quantum yield", Optica, vol. 2, No. 10, Oct. 2015, pp. 841-849.
Papet et al., "19% Efficiency Module Based on Roth&Rau Heterojunction Solar Cells and Day4™ Energy Module Concept", 26th European Photovoltaic Solar Energy Conference and Exhibition, Session 4AV.1.13, 2011, pp. 3336-3339.
Powell et al., "The capital intensity of photovoltaics manufacturing: barrier to scale and opportunity for innovation", Energy & Environmental Science, 2015, vol. 8, No. 12, pp. 3395-3408, doi: 10.1039/C5EE01509J.
Rahman et al., "Efficient tool flow for 3D photovoltaic modelling", Computer Physics Communications, Mar. 30, 2015, vol. 193, pp. 124-130, doi: 10.1016/j.cpc.2015.03.016.
Rau et al., "Thermodynamics of light management in photovoltaic devices", Physical Review B, vol. 90, No. 3, Jul. 15, 2014, pp. 035211-1-035211-16.
Ravikumar, "Photovoltaic Capacity Additions: The optimal rate of deployment with sensitivity to time-based GHG emissions", Masters Thesis, Dec. 2013, Arizona State University, 50 pgs.
Richards et al., "Overcoming the Poor Short Wavelength Spectral Response of CdS/CdTe Photovoltaic Modules via Luminescence Down-Shifting: Ray-Tracing Simulations", Progress in Photovoltaics, Jan. 2007, vol. 15, No. 1, pp. 27-34, published online Sep. 20, 2006, DOI: 10.1002/pip.723.
Rodriguez, "Bifacial solar cells—the two sides of the story", Solar Choice News, New Technologies May 5, 2015, Retrieved from: https://www.solarchoice.net.au/blog/news/bifacial-solar-cells-the-two-sides-of-the-story-050515, 7 pgs.
International Preliminary Report on Patentability for International Application No. PCT/US2019/012916, Report issued Jul. 14, 2020, dated Jul. 23, 2020, 7 pgs.
International Preliminary Report on Patentability for International Application PCT/US2018/061373, Report Issued on May 19, 2020, dated May 28, 2020, 8 pages.
International Search Report and Written Opinion for International Application No. PCT/US2019/012916, Search completed May 3, 2019, dated May 7, 2019, 10 pgs.
International Search Report and Written Opinion for International Application No. PCT/IB2018/056249, Search completed Nov. 8, 2018, dated Dec. 20, 2018, 14 pgs.
International Search Report and Written Opinion for International Application No. PCT/US2018/061373, Search completed Mar. 6, 2019, dated Mar. 7, 2019, 10 pgs.
Aberg et al., "A GaAs Nanowire Array Solar Cell With 15.3% Efficiency at 1 Sun", IEEE Journal of Photovoltaics, Oct. 14, 2015, vol. 6, No. 1, pp. 185-190, doi: 10.1109/JPHOTOV.2015.2484967.
Adams et al., "Are global wind power resource estimates overstated?", Environmental Research Letters, Feb. 25, 2013, vol. 8, No. 1, 15021, doi: 10.1088/1748-9326/8/1/015021.

(56) References Cited

OTHER PUBLICATIONS

Afshinmanesh et al., "Transparent metallic fractal electrodes for semiconductor devices", Nano letters, Aug. 20, 2014, vol. 14, pp. 5068-5074.
Andrews et al., "The Effect of Spectral Albedo on Amorphous Silicon and Crystalline Silicon Solar Photovoltaic Device Performance", Solar Energy, vol. 91, Mar. 22, 2013, pp. 233-241.
Arora et al., "Perovskite solar cells with CuSCN hole extraction layers yield stabilized efficiencies greater than 20%", Science, Nov. 10, 2017, vol. 358, No. 6364, pp. 768-771, doi: 10.1126/science.aam5655.
Arvo, "Backward ray tracing", Developments in Ray Tracing, Computer Graphics, Proc. of ACM SIGGRAPH 86 Course Notes, 1986, pp. 259-263.
Baruch et al., "On some thermodynamic aspects of photovoltaic solar energy conversion", Solar Energy Materials and Solar Cells, vol. 36, No. 2, Feb. 1995, pp. 201-222.
Batchelder et al., "The Luminescent Solar Concentrator", Thesis, California Institute of Technology, 1982, 287 pgs.
Blakers, "Shading losses of solar-cell metal grids", Journal of Applied Physics, May 15, 1992, vol. 71, No. 10, pp. 5237-5241, published online Jun. 4, 1998.
Bomm et al., "Fabrication and spectroscopic studies on highly luminescent CdSe/CdS nanorod polymer composites", Beilstein Journal of Nanotechnology, vol. 1, No. 1, Nov. 29, 2010, pp. 94-100.
Brennan et al., "Effects of Spectral Albedo on Solar Photovoltaic Devices", Solar Energy Materials and Solar Cells, vol. 124, Feb. 19, 2014, pp. 111-116.
Bronstein et al., "Luminescent Solar Concentration with Semiconductor Nanorods and Transfer-Printed Micro-Silicon Solar Cells", ACS Nano, vol. 8, No. 1, Jan. 28, 2014, pp. 44-53.
Bronstein et al., "Quantum Dot Luminescent Concentrator Cavity Exhibiting 30-fold Concentration", ACS Photonics, vol. 2, No. 11, Aug. 17, 2015, pp. 1576-1583.
Burgers, "How to Design Optimal Metallization Patterns for Solar Cells", Progress in Photovoltaics: Research and Applications, May 4, 1999, vol. 7, pp. 457-461, http://www.ecn.nl/docs/library/report/1999/rx99023.pdf.
Carlson et al., "Transfer printing techniques for materials assembly and micro/nanodevice fabrication", Advanced Materials, vol. 24, No. 39, Oct. 9, 2012, Electronic Publication: Aug. 31, 2012, pp. 5284-5318.
Chen et al., "Compact high-quality CdSe—CdS core-shell nanocrystals with narrow emission linewidths and suppressed blinking", Nature Materials, vol. 12, No. 5, May 2013, Electronic Publication: Feb. 3, 2013, pp. 445-451.
Chen et al., "Increasing light capture in silicon solar cells with encapsulants incorporating air prisms to reduce metallic contact losses", Optics Express, vol. 24, No. 22, Oct. 31, 2016, published Sep. 30, 2016, 12 pgs.
Coropceanu et al., "Core/shell quantum dot based luminescent solar concentrators with reduced reabsorption and enhanced efficiency", Nano Letters, vol. 14, No. 7, Jul. 9, 2014, Electronic Publication: Jun. 6, 2014, pp. 4097-4101.
Cuevas et al., "50 Per cent more output power from an albedo-collecting flat panel using bifacial solar cells", Solar Energy, vol. 29, No. 5, 1982, pp. 419-420.
De Souza et al., "Inversion mode n-channel GaAs field effect transistor with high-k/metal gate", Applied Physics Letters, Apr. 16, 2008, vol. 92, No. 15, pp. 153508-1-153508-2, https://doi.org/10.1063/1.2912027.
Debije et al., "Thirty Years of Luminescent Solar Concentrator Research: Solar Energy for the Built Environment", Advanced Energy Materials, vol. 2, No. 1, 2012, pp. 12-35.
Deline et al., "Evaluation and Field Assessment of Bifacial Photovoltaic Module Power Rating Methodologies", IEEE 43rd Photovoltaic Specialists Conference (PVSC), Portland, Oregon, Jun. 5-10, 2016, 6 pgs.
Divitt et al., "Spatial coherence of sunlight and its implications for light management in photovoltaics", Optica, Jan. 27, 2015, vol. 2, No. 2, pp. 95-103, doi: 10.1364/OPTICA.2.000095.
Ellmer, "Past achievements and future challenges in the development of optically transparent electrodes", Nature Photonics, Nov. 30, 2012, vol. 6, pp. 809-817.
Essig et al., "Mechanically stacked 4-terminal III-V/Si tandem solar cells", Conference paper, Jun. 2017, 2 pgs.
Essig et al., "Realization of GaInP/Si dual-junction solar cells with 29.8% one-sun efficiency", IEEE Journal of Photovoltaics, vol. 6, No. 4, Jul. 2016, Date of Publication: Apr. 27, 2016, 7 pgs.
Feldmann et al., "Carrier-selective contacts for Si solar cells", Applied Physics Letters, vol. 104, No. 18, May 8, 2014, pp. 181105-1-181105-4.
Ferry et al., "Light trapping in ultrathin plasmonic solar cells", Optics Express, Jun. 24, 2010, vol. 18, pp. A237-A245.
Fertig et al., "Bifacial potential of single- and double-sided collecting silicon solar cells", Progress in Photovoltaics: Research and Applications, vol. 24, No. 6, Jan. 13, 2016, pp. 818-829.
Fertig et al., "Economic feasibility of bifacial silicon solar cells", Progress in Photovoltaics: Research and Applications, vol. 24, No. 6, Jan. 14, 2016, pp. 800-817.
Fraunhofer, "Photovoltaics Report", Fraunhofer ISE, Freiburg, 2014, 44 pgs.
Gallagher et al., "Quantum dot solar concentrator behaviour, predicted using a ray trace approach", International Journal of Ambient Energy, vol. 25, No. 1, Jan. 2004, pp. 47-56.
Gangopadhyay et al., "Front Grid Design For Plated Contact Solar Cells", IEEE, 399-402, 2002.
Geisz et al., "Enhanced external radiative efficiency for 20.8% efficient single-junction GaInP solar cells", Applied Physical Letters, vol. 103, No. 4, Jul. 25, 2013, pp. 041118-1-041118-5.
Goetzberger et al., "Solar Energy Conversion with Fluorescent Collectors", Applied Physics, vol. 14, No. 2, Oct. 1977, pp. 123-129.
Goldschmidt et al., "Increasing the efficiency of fluorescent concentrator systems", Solar Energy Materials and Solar Cells, vol. 93, No. 2, Feb. 2009, pp. 176-182, available online Nov. 20, 2008.
Goncharov et al, "Reconstruction of the optical system of the human eye with reverse ray-tracing", Optics express, Feb. 4, 2008, vol. 16, No. 3, pp. 1692-1703.
Green, "Self-consistent optical parameters of intrinsic silicon at 300 K including temperature coefficients", Solar Energy Materials and Solar Cells, vol. 92, No. 11, Nov. 2008, pp. 1305-1310.
Guerrero-Lemus et al., "Bifacial solar photovoltaics—A technology review", Renewable and Sustainable Energy Reviews, Mar. 8, 2016, vol. 60, pp. 1533-1549.
Guo et al., "Vertically mounted bifacial photovoltaic modules: A global analysis", Energy, vol. 61, Nov. 1, 2013, pp. 447-454, available online Sep. 23, 2013.
Romer et al., "Ion Implantation for Poly-Si Passivated Back-Junction Back-Contacted Solar Cells", IEEE Journal of Photovoltaics, vol. 5, No. 2, Mar. 2015, pp. 507-514.
Rowan et al., "Advanced Material Concepts for Luminescent Solar Concentrators", IEEE Journal of Selected Topics in Quantum Electronics, vol. 14, No. 5, Nov. 2008, pp. 1312-1322.
Rowell et al., "Transparent electrode requirements for thin film solar cell modules", Energy & Environmental Science, 2011, vol. 4, pp. 131-134.
Russell et al., "The Influence of Spectral Albedo on Bifacial Solar Cells: A Theoretical and Experimental Study", IEEE Journal of Photovoltaics, vol. 7, No. 6, Nov. 2017, pp. 1611-1618.
Sahin et al., "Monte-Carlo simulation of light propagation in luminescent solar concentrators based on semiconductor nanoparticles", Journal of Applied Physics, vol. 110, No. 3, Aug. 11, 2011, pp. 03108-1-033108-8.
Saive et al, "Effectively transparent contacts (ETCs) for solar cells", Photovoltaic Specialists Conference (PVSC), 2016 IEEE 43rd, 2016, pp. 3612-3615: IEEE.
Saive et al, "Effectively transparent front contacts for optoelectronic devices", Advanced Optical Materials, Jun. 10, 2016, vol. 4, No. 10, pp. 1470-1474, doi: 10.1002/adom.201600252.

(56) References Cited

OTHER PUBLICATIONS

Saive et al, "Enhancing the Power Output of Bifacial Solar Modules by Applying Effectively Transparent Contacts (ETCs) With Light Trapping", IEEE Journal of Photovoltaics, Sep. 2018, vol. 8, No. 5, pp. 1183-1189.
Saive et al, "Silicon heterojunction solar cells with effectively transparent front contacts", Sustainable Energy & Fuels, 2017, vol. 1, pp. 593-598.
Saive et al., "Effectively Transparent Front Contacts for Optoelectronic Devices", Advanced Optical Materials, 2016, 5 pgs.
Saive et al., "Enhanced Light Trapping in Thin Silicon Solar Cells using Effectively Transparent Contacts (ETCs)", 44th IEEE Photovoltaic Specialist Conferences, Aug. 2017, 5 pgs.
Saive et al., "Light Trapping in Bifacial Solar Modules Using Effectively Transparent Contacts (ETCs)", 45th IEEE Photovoltaic Specialist Conference, Aug. 2018, 3 pgs.
Saive et al., "Mesoscale trumps nanoscale: metallic mesoscale contact morphology for improved light trapping, optical absorption and grid conductance in silicon solar cells", Optics Express, Mar. 6, 2018, vol. 26, No. 6, pp. A275-A282, doi: 10.1364/OE.26.00A275.
Saive et al., "Three-dimensional nanoimprint lithography using two-photon lithography master samples", arXiv preprint arXiv:1702.04012v1, 2017.
Saive et al., "Transparent, Conductive and Lightweight Superstrates for Perovskite Solar Cells and Modules", 45th IEEE Photovoltaic Specialist Conference, Aug. 2018, 5 pgs.
Sanyo Energy Corp, "Bifacial Photovoltaic Module", Hit photovoltaic module double, Jan. 9, 2008, 2 pgs.
Sark et al., "Luminescent Solar Concentrators: The route to 10% efficiency", IEEE Photovoltaic Specialist Conference, Jun. 8-13, 2014, pp. 2276-2278.
Sheldon et al., "Evaluation of ITO/GaAs solar cells", Journal of Vacuum Science and Technology, 1982, vol. 20, No. 3, pp. 410-413, doi: 10.1116/1.571479.
Shockley et al., "Detailed Balance Limit of Efficiency of p-n Junction Solar Cells", Journal of Applied Physics, vol. 32, No. 3, Mar. 1961, pp. 510-519.
Sholin et al., "Semiconducting polymers and quantum dots in luminescent solar concentrators for solar energy harvesting", Journal of Applied Physics, vol. 101, No. 12, Jun. 28, 2007, pp. 123114-1-123114-9.
Slooff et al., "A Luminescent Solar Concentrator with 7.1% power conversion efficiency", Phys. Status Solid-Rapid Res. Letter, vol. 2, No. 6, 2008, pp. 257-259, published online Sep. 6, 2008.
Soderstrom et al., "Smart Wire Connection Technology", 28th European Photovoltaic Solar Energy Conference and Exhibition, Session 1CV.2.17, 2013, pp. 495-499.
Soria et al., "A study of the annual performance of bifacial photovoltaic modules in the case of vertical facade integration", Energy Science & Engineering, vol. 4, No. 1, Nov. 26, 2015, pp. 52-68.
Sze et al., "Physics of semiconductor devices", Hoboken, NJ, Wiley-Interscience, 2007, 763 pgs. ([presented in three parts).
Taguchi et al., "24.7% record efficiency HIT solar cell on thin silicon wafer", IEEE Journal of Photovoltaics, Jan. 2014, vol. 4, pp. 96-99.
Unknown Author, "Bright Green Tree—Waikato", https://commons.wikimedia.org/wiki/File:Bright_green_tree_-_Waikato.jpg, 2005.
Valdivia et al., "Bifacial Photovoltaic Module Energy Yield Calculation and Analysis", IEEE PVSC 2017 Conference Proceedings, 2017, pp. 1094-1099.
Van Dam et al., "High-Efficiency Nanowire Solar Cells with Omnidirectionally Enhanced Absorption Due to Self-Aligned Indium-Tin-Oxide Mie Scatterers", ACS Nano, Nov. 29, 2016, vol. 10, No. 12, pp. 11414-11419, doi: 10.1021/acsnano.6b06874.

Van De Groep et al., "Transparent Conducting Silver Nanowire Networks", Nano Letters, May 3, 2012, vol. 12, pp. 3138-3144, doi:10.1021/n1301045a.
Vest et al., "Levelized Cost and Levelized Avoided Cost of New Generation Resources in the Annual Energy Outlook 2016", U.S. Energy Information Administration, Aug. 2016, 20 pgs.
Vogt, "Development of Physical Models for the Simulation of Optical Properties of Solar Cell Modules", Hannover, Leibniz Information Centre For Science and Technology University Library, Thesis, 2015, 161 pgs.
Vogt et al., "Measurement of the Optical Constants of Soda-Lime Glasses in Dependence of Iron Content and Modeling of Iron-Related Power Losses in Crystalline Si Solar Cell Modules", IEEE Journal of Photovoltaics, vol. 6, No. 1, Nov. 19, 2015, pp. 111-118.
Vogt et al., "Optical Constants of UV Transparent EVA and the Impact on the PV Module Output Power under Realistic Irradiation", Energy Procedia, vol. 92, Aug. 2016, pp. 523-530.
Wallentin et al., "InP Nanowire Array Solar Cells Achieving 13.8% Efficiency by Exceeding the Ray Optics Limit", Science, Mar. 1, 2013, vol. 339, No. 6123, pp. 1057-1060, doi: 10.1126/science.1230969.
Wang et al, "Image quality assessment: from error visibility to structural similarity", IEEE transactions on image processing, Apr. 2004, vol. 13, No. 4, pp. 600-612.
Ward et al., "High aspect ratio electrodeposited Ni/Au contacts for GaAs-based III-V concentrator solar cells", Progress in Photovoltaics: Research and Applications, No. 23, 2015, Published online Mar. 20, 2014, pp. 646-653.
Wheeler et al., "Switchable Photovoltaic Windows Enabled by Reversible Photothermal Complex Dissociate from Methylammonium Lead Iodide", Nature Communications, vol. 8, No. 1722, 2017, pp. 1-9.
Wittwer et al., "Fluorescent Planar Concentrators", Solar Energy Materials and Solar Cells, vol. 11, No. 3, 1984, pp. 187-197.
Woodhouse et al., "A Manufacturing Cost Analysis Relevant to Single- and Dual-Junction Photovoltaic Cells Fabricated with III-Vs and III-Vs Grown on Czochralski Silicon", National Renewable Energy Lab, Sep. 30, 2013, 92 pgs.
Wurfel et al., "Charge Carrier Separation in Solar Cells", IEEE Journal of Photovoltaics, Nov. 20, 2014, vol. 5, No. 1, pp. 461-469, doi: 10.1109/JPHOTOV.2014.2363550.
Xie et al., "InAs/InP/ZnSe core.shell/shell quantum dots as near-infrared emitters: Bright, narrow-band, non-cadium containing, and biocompatible", Nano Research, vol. 1, No. 6, 2008, pp. 457-464.
Yablonovitch, "Statistical ray optics", Journal of the Optical Society of America, vol. 72, No. 7, Jul. 1982, pp. 899-907.
Yablonovitch, "Thermodynamics of the fluorescent planar concentrator", Journal of the Optical Society of America, vol. 70, No. 11, Nov. 1980, pp. 1362-1363.
Yin et al., "19.2% Efficient InP Heterojunction Solar Cell with Electron-Selective TiO2 Contact", ACS Photonics, Sep. 25, 2014, vol. 1, No. 12, pp. 1245-1250, doi: 10.1021/ph500153c.
Yu et al., "Selecting tandem partners for silicon solar cells", Nature Energy, Nov. 2016, vol. 1, No. 11, Article 16137, pp. 1-4, published Sep. 26, 2016, doi: 10.1038/nenergy.2016.137.
Yusufoglu et al., "Analysis of the Annual Performance of Bifacial Modules and Optimization Methods", IEEE Journal of Photovoltaics, vol. 5, No. 1, Nov. 20, 2014, pp. 320-328.
Zheng et al., "Graphene oxide-based transparent conductive films", Progress in Materials Science, Mar. 25, 2014, vol. 64, pp. 200-247.
Zhou et al., "Near Infrared, Highly Efficient Luminescent Solar Concentrators", Advanced Energy Materials, vol. 6, No. 11, Jun. 8, 2016, pp. 1-8.
Reda, "Synthesis and optical properties of CdS quantum dots embedded in silica matrix thin films and their applications as luminescent solar concentrators", Acta Materialia, 56, 2008, pp. 259-264, doi:10.1016/j.actamat.2007.09.017.

* cited by examiner

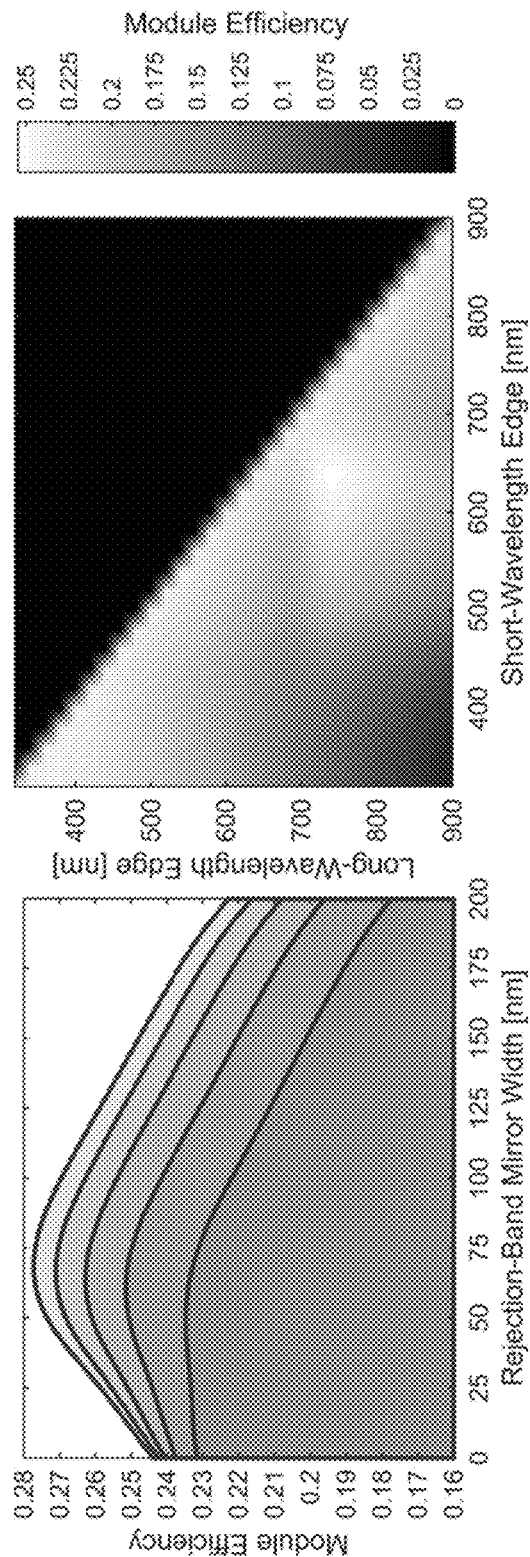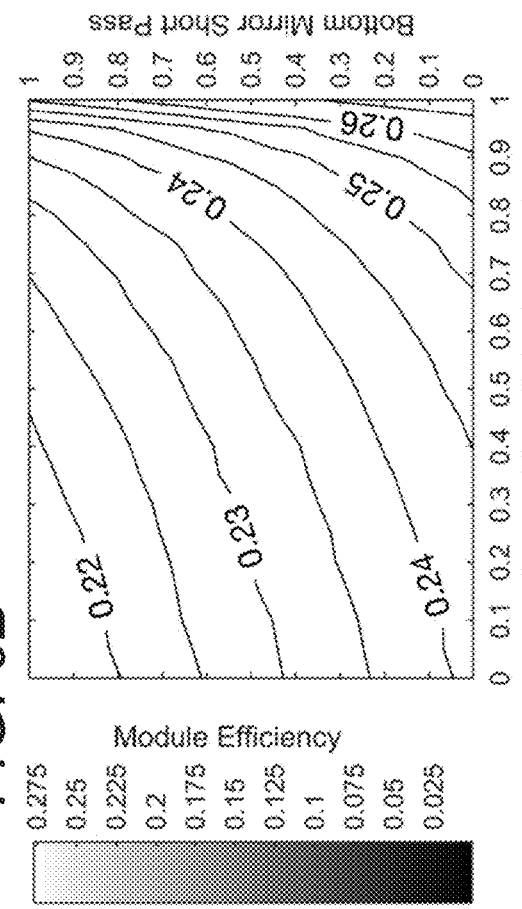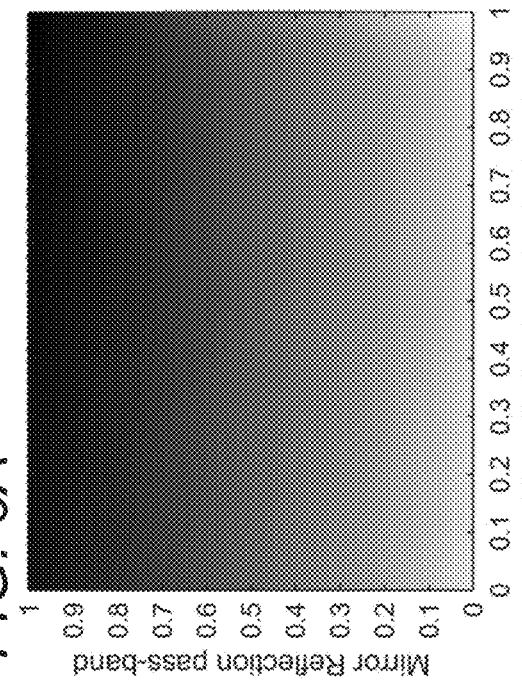
FIG. 6A  FIG. 6B  FIG. 6C  FIG. 6D

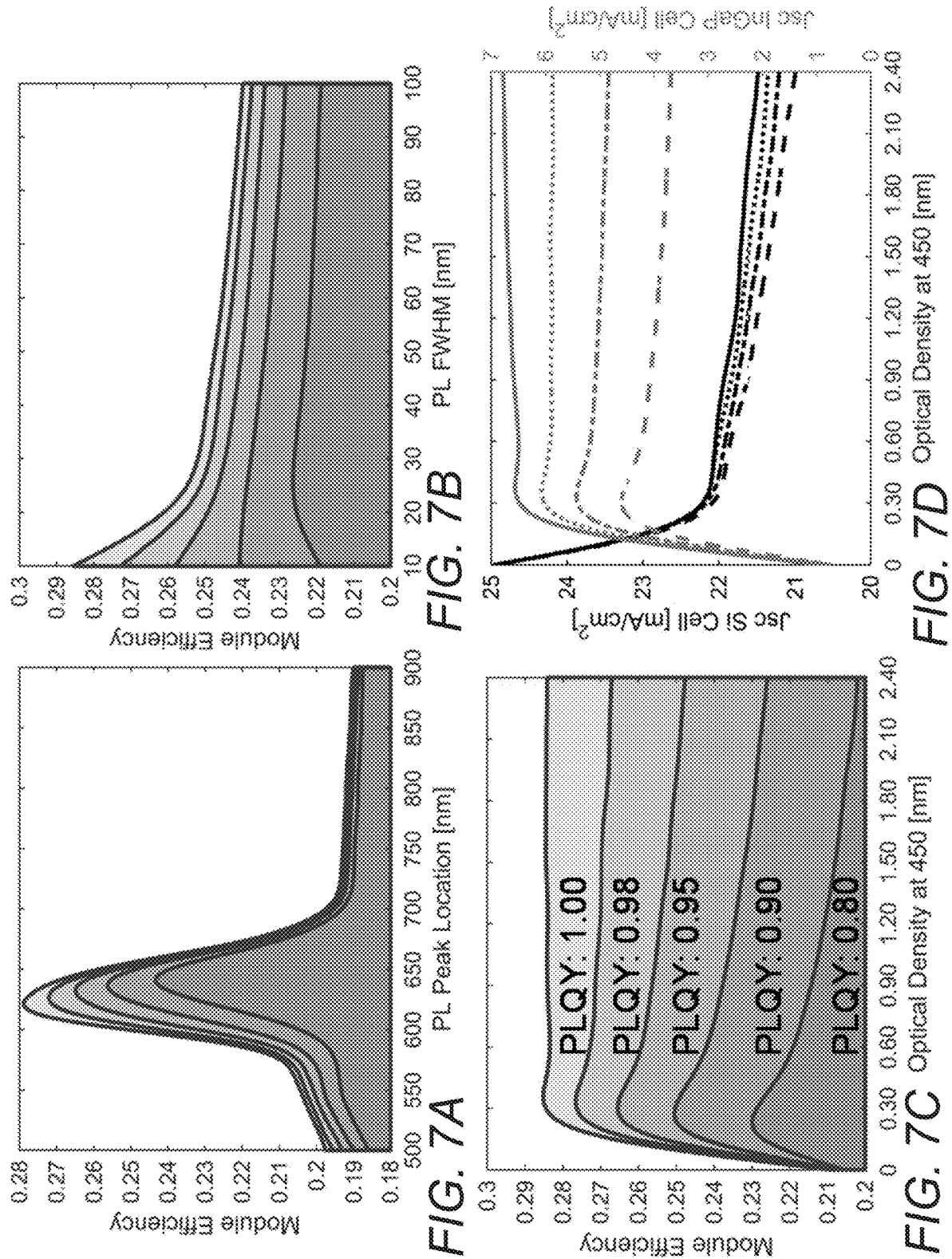

LUMINESCENT SOLAR CONCENTRATORS AND RELATED METHODS OF MANUFACTURING

CROSS-REFERENCE TO RELATED APPLICATIONS

The current application claims the benefit of and priority under 35 U.S.C. § 119(e) to U.S. Provisional Patent Application No. 62/550,115 entitled "Micro-Optical Tandem Luminescent Solar Concentrator," filed Aug. 25, 2017. The disclosure of U.S. Provisional Patent Application No. 62/550,115 is hereby incorporated by reference in its entirety for all purposes.

STATEMENT REGARDING FEDERALLY SPONSORED RESEARCH OR DEVELOPMENT

This invention was made with government support under Grant No(s). DE-AR0000627, 113808, S-143159 and DE-AC02-05CH11231 awarded by the Department of Energy. The government has certain rights in the invention.

FIELD OF THE INVENTION

The present invention generally relates to luminescent solar concentrators and, more specifically, to luminescent solar concentrators with embedded luminophores.

BACKGROUND

Silicon photovoltaic ("Si—PV") modules currently dominate the solar energy market. Increased progress into Si—PV efficiency enhancements combined with historically low module costs aim to decrease the overall Levelized Cost of Electricity ("LCOS") to a point competitive with non-renewable energy sources. Despite recent LCOE reductions, Si—PV technology remains economically inferior to fossil fuels. Additionally, flat-plate Si solar modules generally require geographical locations with high direct normal incidence ("DNI") sunlight conditions in order to maintain module performance. Both the strict DNI requirement and the high LCOE of Si—PV cells ultimately limit the dissemination of solar power into the global energy market.

A solution for the capturing of diffuse sunlight includes the use of optical concentrators, which can be referred to as devices for concentrating electromagnetic radiation for the purposes of generating electricity. An optical concentrator typically includes parallel layers of materials designed to gather incoming radiation from an input area and redirect the gathered radiation to an output area. If the effective input area is larger than the effective output area, the output can theoretically result in a higher irradiance than the input. A concentration factor can then be defined as the ratio between the output and input irradiance of the whole device. However, some of the gathered light may not be useable due to losses from absorption and escaped light. As such, an efficiency metric of optical concentrators can be defined as the ratio of the incoming radiant flux and the outgoing wattage—i.e., the fraction of incoming energy that the device can deliver as usable output energy.

One class of optical concentrators includes luminescent solar concentrators ("LSCs"). A traditional LSC can include an optical waveguide with luminophores suspended in a polymer matrix and photovoltaic ("PV") material lining the edge(s) of the waveguide. In such devices, both diffuse and direct sunlight incident upon the waveguide can be absorbed by the embedded luminophores. If not non-radiatively absorbed by the luminophore, the absorbed photons can isotropically photoluminesce at longer wavelengths. Total internal reflection ("TIR") can be utilized to guide the re-emitted photons to the edge(s) of the waveguide, thereby impinging upon the PV cells. Concentration of light is directly proportional to the geometric gain ("GG") of the LSC—defined as the ratio of waveguide illumination area to total PV cell area. Luminescent solar concentrators have garnered interest due to their ability to utilize diffuse light and their potential for use in architectural applications such as large area power-generating windows. However, LSCs have not yet reached commercialization for photovoltaic power generation, largely due to their comparatively low power conversion efficiencies ("PCEs") and lack of scalability.

SUMMARY OF THE INVENTION

One embodiment includes a luminescent solar concentrator including a waveguide configured to trap light incident on a first surface via total internal reflection, the waveguide including embedded luminophores configured to absorb at least a portion of the trapped light and emit photoluminesced light, and at least one embedded planar cell disposed on a second surface opposite the first surface, the at least one embedded planar cell configured to absorb and convert at least a portion of the photoluminesced light to an electric signal.

In another embodiment, the luminescent solar concentrator further includes a subcell configured to absorb and convert at least a portion of the trapped light and at least a portion of the photoluminesced light to an electric signal.

In a further embodiment, the subcell includes a silicon subcell.

In still another embodiment, the luminescent solar concentrator further includes a first and second selectively-reflective mirrors configured to filter light of specific wavelengths, wherein the first selectively-reflective mirror is configured to filter light before such that passed light is incident on the waveguide, and the second selectively-reflective mirror is disposed between the waveguide and the subcell.

In a still further embodiment, the luminescent solar concentrator further includes a plurality of glass slides.

In yet another embodiment, the luminescent solar concentrator is constructed with an air gap between the waveguide and the first selectively-reflective mirror.

In a yet further embodiment, the luminescent solar concentrator is constructed with an air gap between the waveguide and the second selectively-reflective mirror.

In another additional embodiment, at least one of the selectively-reflective mirrors includes a structure selected from the group of a metasurface mirror, a polymeric stack filter, and a Bragg grating, a dielectric stack.

In a further additional embodiment, at least one of the selectively-reflective mirrors includes a high contrast grating metasurface mirror.

In another embodiment again, the high contrast grating metasurface mirror includes a hexagonal array of AlSb cylindrical pillars patterned on a glass substrate.

In a further embodiment again, the hexagonal array of AlSb cylindrical pillars has a pitch of about 475-515 nm and the AlSb cylindrical pillars have thicknesses of about 85-125 nm and radii of about 80-120 nm.

In still yet another embodiment, the first selectively-reflective mirror includes a high contrast grating metasurface mirror and the second selectively-reflective mirror includes a dielectric stack.

In a still yet further embodiment, the at least one embedded planar cell includes a cell selected from group of an InGaP cell and a GaAs cell.

In still another additional embodiment, the at least one embedded planar cell includes an array of embedded planar cells.

In a still further additional embodiment, the at least one embedded planar cell includes a bifacial cell.

In still another embodiment again, the waveguide includes a polylaurylmethacrylate.

In a still further embodiment again, the waveguide includes a material selected from the group of polymethyl methacrylate, polydimethylsiloxane, and ethylene-vinyl acetate.

In yet another additional embodiment, the embedded luminophores include CdSe/CdS quantum dots.

In a yet further additional embodiment, the embedded luminophores include luminophores selected from the group of InP quantum dots, Si quantum dots, and nanorods.

In yet another embodiment again, the emitted light is of a longer wavelength than the trapped light absorbed by the embedded luminophores.

Additional embodiments and features are set forth in part in the description that follows, and in part will become apparent to those skilled in the art upon examination of the specification or may be learned by the practice of the invention. A further understanding of the nature and advantages of the present invention may be realized by reference to the remaining portions of the specification and the drawings, which forms a part of this disclosure.

BRIEF DESCRIPTION OF THE DRAWINGS

FIG. 6A shows tandem LSC-Si module efficiency for varying rejection-band widths in accordance with an embodiment of the invention.

FIG. 6B shows tandem LSC-Si module efficiency for varying rejection-band left edge and right edge locations in accordance with an embodiment of the invention.

FIG. 6C shows tandem LSC-Si module efficiency for varying $R_{rejection}$ vs. $R_{pass}$ across all angles at ideal rejection-band widths in accordance with an embodiment of the invention.

FIG. 6D shows tandem LSC-Si module efficiency for varying $R_{short-pass}$ of the bottom mirror in accordance with an embodiment of the invention.

FIGS. 7A-7D show tandem LSC-Si module efficiency in the perfect-mirrors case in accordance with various embodiments of the invention.

DETAILED DESCRIPTION

Figure 1A:
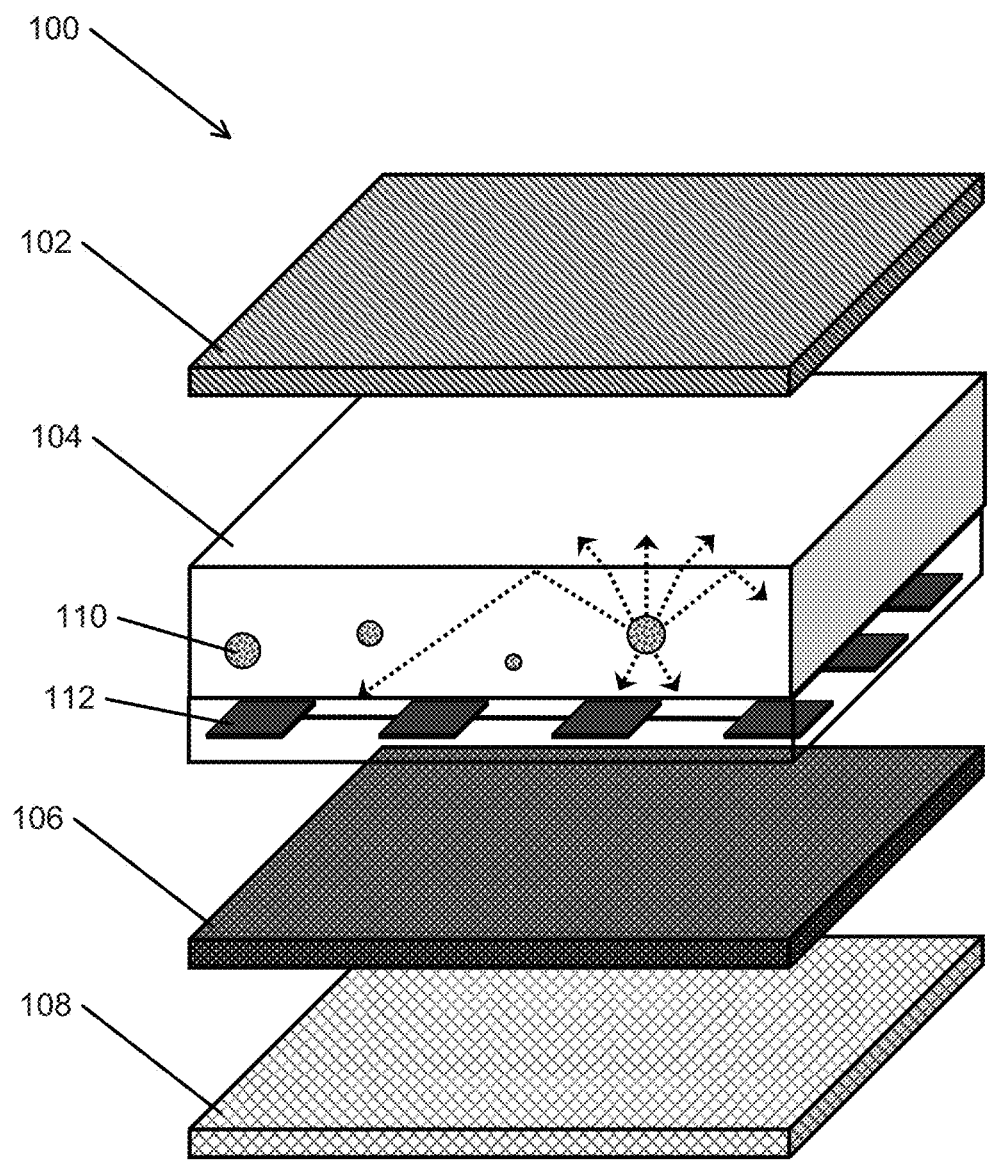
FIG. 1A conceptually illustrates an exploded isometric view of a micro-optical tandem luminescent solar concentrator in accordance with an embodiment of the invention.

Luminescent solar concentrators offer a unique solution to capture sunlight and to reduce the overall Levelized Cost of Electricity. LSC module efficiency can suffer from two key loss mechanisms. First, embedded luminophores can require near-unity photoluminescence quantum yield ("PLQY") in order to achieve desired optical efficiencies. To prevent further luminophore parasitic absorption, separation between absorbed and emitted photon energies (i.e., the Stokes shift) should be maximized. Historically, luminophores have not been able to maintain high enough PLQY and large Stokes shifts. Thus, many incident photons are usually parasitically absorbed by the luminophores in traditional devices. Second, the index of refraction contrast between the optical waveguide and the surrounding medium can limit complete photon trapping. Polymer waveguides experience significant escape cone losses for photons radiated at angles that lie between normal incidence and the critical angle of the waveguide.

Luminescent solar concentrators in accordance with various embodiments of the invention can incorporate various novel components and techniques to minimize photon thermalization losses and incomplete light trapping. Such components and techniques can include but are not limited to efficient quantum dot ("QD") luminophores, planar and micro-scale InGaP solar cells, selectively-reflective metasurface mirrors and polymeric stack filters for further light trapping, LSC-Si tandem architecture, novel waveguide materials (e.g., EVA, PMMA, PLMA), anisotropic luminophore emission through metasurface/plasmonic antenna coupling, red-shifted luminophores and GaAs microcells, and a hybridization of an LSC and traditional Si solar cell technology.

In many embodiments, the LSC includes a waveguide, an absorber material, and at least one solar cell. During operation, light incident on the surface of the waveguide can be redirected through refraction and TIR to travel within the waveguide structure. In some embodiments, at least a portion of the trapped light is redirected to the absorber material. The absorber material can be designed to selectively absorb a subsection of the trapped light. Depending on the type of absorber material, different ranges of wavelengths of light may be absorbed. In several embodiments, the absorber material is a luminescent material capable of emitting light under an external application of energy. In such embodiments, the absorbed light can be re-emitted. In some embodiments, the absorbed light can be re-emitted at a different wavelength. In a number of embodiments, the waveguide structure traps and redirects the photoluminesced light toward the solar cell(s) for energy conversion.

Waveguides in accordance with various embodiments of the invention can be made of any of a variety of materials, such as but not limited to polymethyl methacrylate ("PMMA"), polydimethylsiloxane ("PDMS"), ethylene-vinyl acetate ("EVA"), polylaurylmethacrylate ("PLMA"), and other suitable polymers. In some embodiments, photovoltaic cells can be embedded within the waveguide to efficiently capture the trapped light. In several embodiments, microcells and/or planar cells can be embedded within a waveguide. Various PV materials can be utilized, such as but not limited to InGaP and GaAs. In many embodiments, bifacial solar cells, including but not limited to InGaP bifacial cells and GaAs bifacial cells, can be embedded within a waveguide. In further embodiments, an array of such solar cells, including bifacial cells, can be embedded within a waveguide. Suitable LSC optical designs typically trap light emitted by the luminescent material in all directions and redirect it such that the minimal amount escapes the photovoltaic converters. Redirection techniques can include internal reflection, refractive index gradients, and diffraction. In a number of embodiments, an LSC top cell working in tandem with a subcell is implemented to allow for greater energy conversion efficiency. For example, an LSC top cell can work in tandem with a traditional single-junction silicon photovoltaic cell to allow for greater energy conversion efficiency compared to a Si-only module. In further embodiments, wavelength-selective mirrors are applied as cladding to the LSC to increase the concentration factor and overall module efficiency.

Many types of absorber materials can be utilized in accordance with various embodiments of the invention. In several embodiments, luminophores are utilized as the absorber materials. In further embodiments, the LSC incorporates luminophores that allow for near-unity QDs and sufficiently large Stokes shifts. One such type of luminophore includes cadmium sulfide shell (CdSe/CdS) quantum dots. Luminophores utilized in various embodiments of the invention can also include but are not limited to InP quantum dots, Si quantum dots, and nanorods. Both organic and inorganic luminophores can be implemented in an LSC. In a number of embodiments, the luminophores are configured to absorb short wavelength, high energy light and re-emit a longer wavelength, lower energy light. In a number of embodiments, luminophores are dispersed and embedded within a waveguide structure. Inorganic QD luminophores can span a wide wavelength range of absorption and PL features. For instance, CdSe/CdS core/shell QDs typically exhibit absorption bands near 500 nm in wavelength and PL peaks centered near 650 nm, whereas $Cd_{1-x}Cu_xSe$ QDs absorb farther into the red (around 700 nm) and emit around 900 nm. LSC devices incorporating embedded luminophores and the characterization of such devices are described in the sections below in further detail.

Micro-Optical Tandem Luminescent Solar Concentrators

LSC devices in accordance with various embodiments of the invention can be designed to minimize photon thermalization losses and incomplete light trapping using various components and techniques. In many embodiments, the LSC includes a waveguide with embedded luminophores and at least one solar cell. During operation, light incident on the waveguide can be redirected throughout the waveguide through refraction and TIR. The trapped light can be absorbed by the embedded luminophores and re-emitted. The type of luminophores used can be selected such that a specific range of wavelengths is absorbed. In some embodiments, the luminophores are chosen to absorb short wavelength, high energy light and re-emit a longer wavelength, lower energy light. The re-emitted light can be redirected towards the solar cell(s) for energy conversion.

In many embodiments, an LSC component is optically connected in tandem with a planar solar cell, forming a micro-optical tandem luminescent solar concentrator ("MOTLSC"). In further embodiments, the planar solar cell is a Si cell. Si—PV typically does not exhibit strong external quantum efficiency ("EQE") in the short wavelength regime as a result of front surface absorption and non-radiative recombination. However, an LSC-Si tandem module can allow for greater spectral efficiency across the solar spectrum. For example, in several embodiments, planar InGaP microcells are embedded in the LSC device. The EQE of InGaP can be tuned to the photoluminescence ("PL") emission wavelength. Planar InGaP cell geometry can allow for more rigorous control of the GG, resulting in further optimization of the overall power conversion efficiency. In a number of embodiments, GaAs microcells are implemented, and the MOTLSC can be designed accordingly.

Figure 1B:
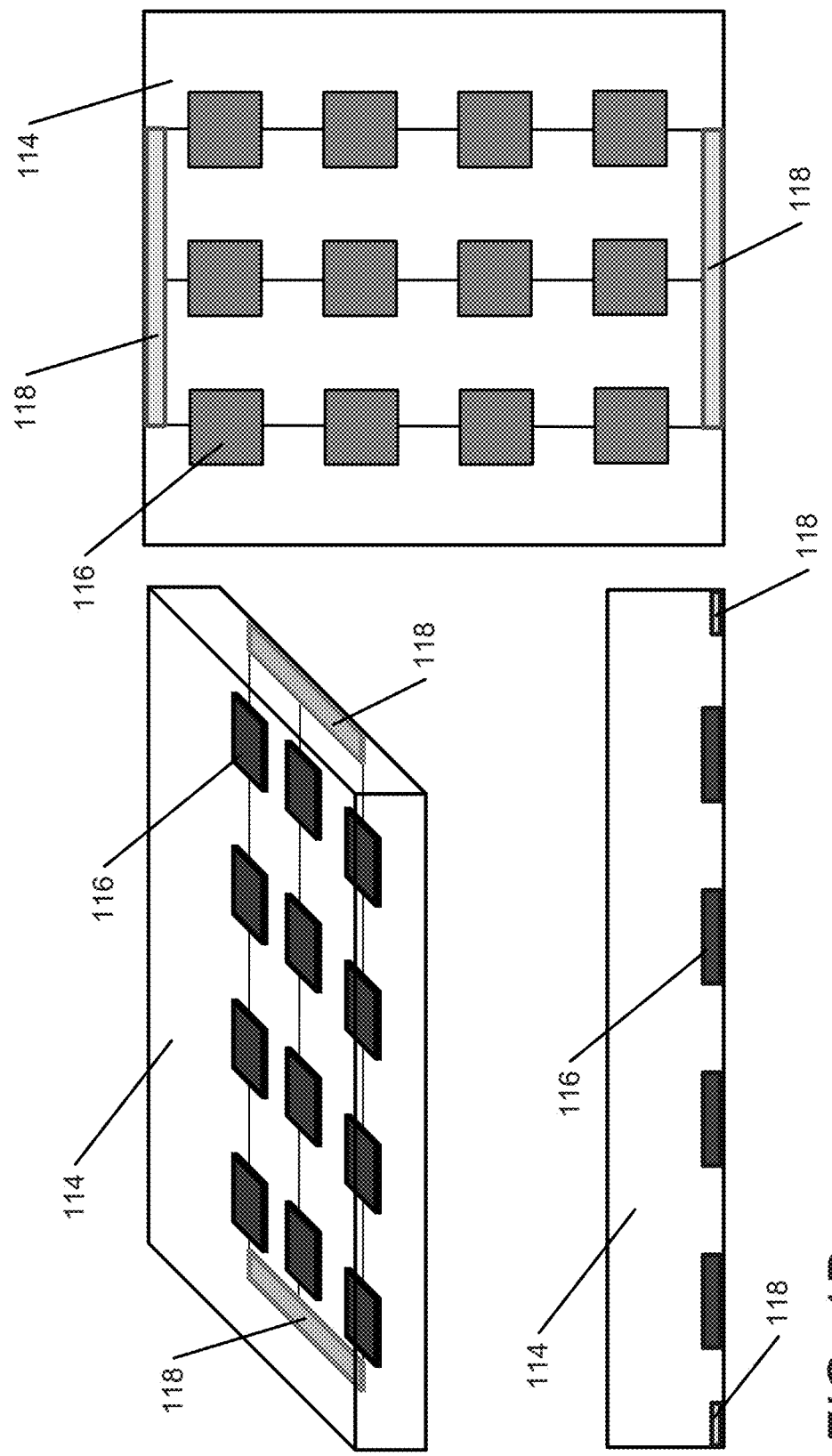
FIG. 1B conceptually illustrates various views of a waveguide structure with an embedded array of solar cells in accordance with an embodiment of the invention.

An exploded isometric view of a micro-optical tandem luminescent solar concentrator in accordance with an embodiment of the invention is conceptually illustrated in FIG. 1A. As shown, the MOTLSC 100 includes a first mirror 102, a polymer waveguide 104, a second mirror 106, and a subcell 108. In many embodiments, the first and second mirrors 102, 106 function as wavelength-selective filters for the aid in the confinement of light. The mirrors 102, 106 can also be referred to as top and bottom mirrors, relative to the subcell 108. Such filters can be implemented in various ways, including but not limited to using alternative dielectric materials in an aperiodic fashion, extruding polymers into a stack of low/high index of refraction materials, and applying various materials (e.g., AlSb, ZnO, TiO2, etc.) in a sub-wavelength periodic structure (e.g., a metasurface or conventional Bragg gratings) to reflect certain wavelengths of incident light. In a number of embodiments, high contrast grating metasurfaces are implemented as wavelength-selective filters due to their tunable reflectance spectrum and potentially lower fabrication costs. Suitable materials for the polymer waveguide 104 can include but are not limited to EVA, PMMA, PLMA, and PDMS. In the illustrative embodiment, the polymer waveguide 104 includes embedded luminophores 110 for the absorption and reemission of light. Examples of luminophores can include but are not limited to CdSe/CdS QDs, InP QDs, Si QDs, and nanorods. The polymer waveguide 104 further includes an array of embedded solar cells 112. Various PV materials can be utilized, such as but not limited to InGaP and GaAs. In many embodiments, bifacial cells can be utilized. FIG. 1B conceptually illustrates various views of a waveguide structure with an embedded array of solar cells in accordance with an embodiment of the invention. As shown, the waveguide includes 114 an array of interconnected microcells 116 and array busbars 118 configured for energy extraction.

Figure 2A:
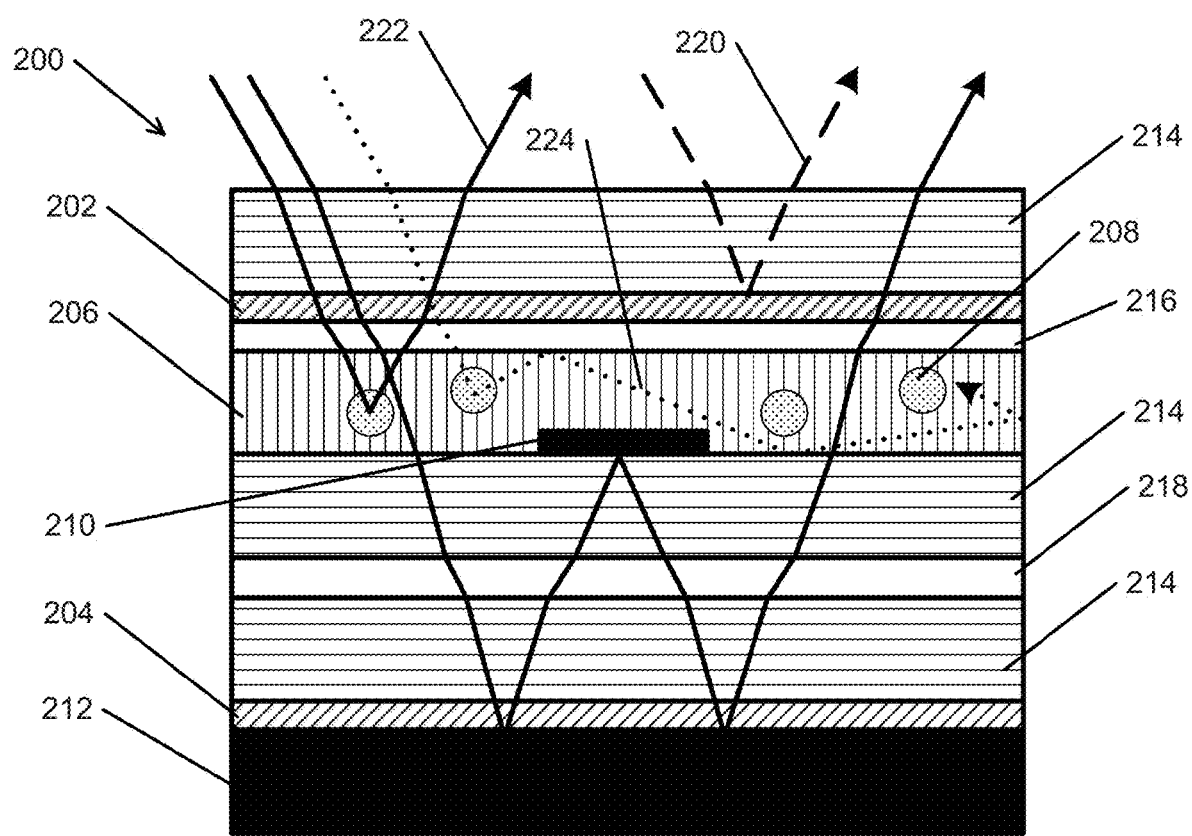
FIG. 2A conceptually illustrates a side view schematic of an exemplary MOTLSC construction along with a diagram of optical losses in accordance with an embodiment of the invention.
Figure 2B:
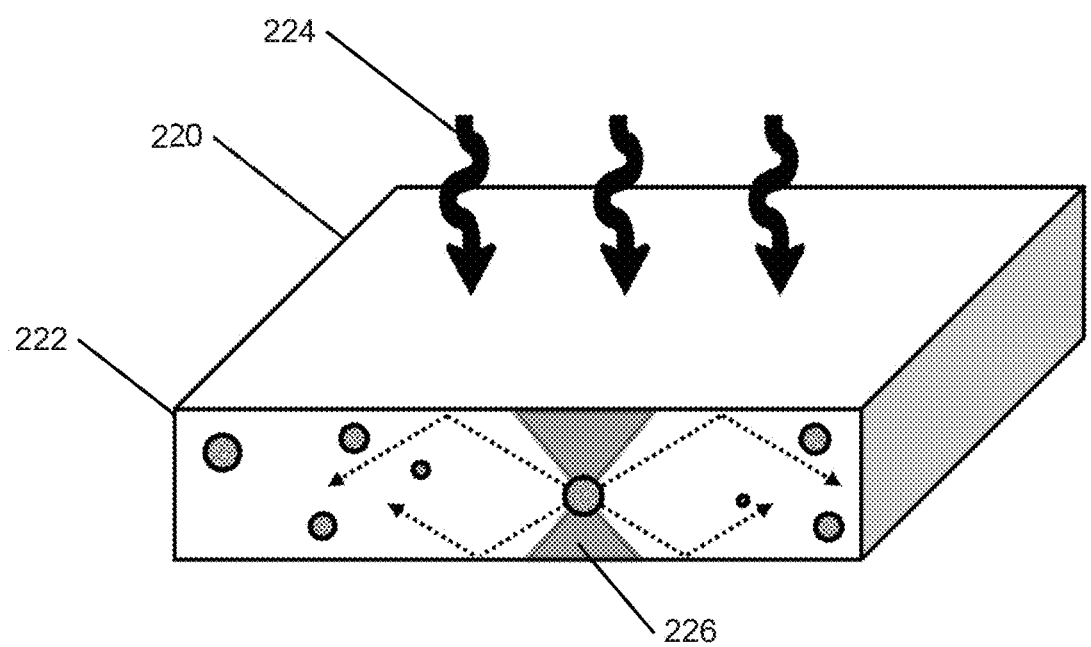
FIG. 2B conceptually illustrates the escape cone of luminophores embedded in a waveguide in accordance with an embodiment of the invention.

Although FIGS. 1A and 1B illustrates a specific MOTLSC construction, various configurations can be implemented. FIG. 2A conceptually illustrates a side view schematic of an exemplary MOTLSC construction along with a diagram of optical losses in accordance with an embodiment of the invention. In the illustrative embodiment, the constructed MOTLSC 200 includes a first mirror 202, a second mirror 204, a polymer waveguide 206 incorporating luminophores 208 and an InGaP cell 210, and a subcell 212. The constructed MOTLSC also includes multiple glass slides 214 and two air gaps 216, 218, which can serve various purposes, such as providing a desired refractive index interface to aid in the confinement of light. As shown, there are various sources of optical losses from light that are not ultimately converted to energy. Such losses can include mirror reflection losses 220, escape cone angle losses 222, and non-unity QD losses 224. Escape cone losses can result from light re-emitted by the luminophores at an angle below the critical angle, allowing light to refract out of the waveguide. FIG. 2B conceptually illustrates the escape cone of luminophores embedded in a waveguide in accordance with an embodiment of the invention. As shown, the waveguide 220 includes embedded luminophores 222. Incident rays 224 on the waveguide 220 can be trapped and absorbed by the luminophores 222. Once the light is absorbed, the luminophores 222 can re-emit the light at various angles. A range of angles, termed the escape cone 226, is shown and describes the angles of emission at which the light can refract out of the waveguide is shown.

Figure 3B:
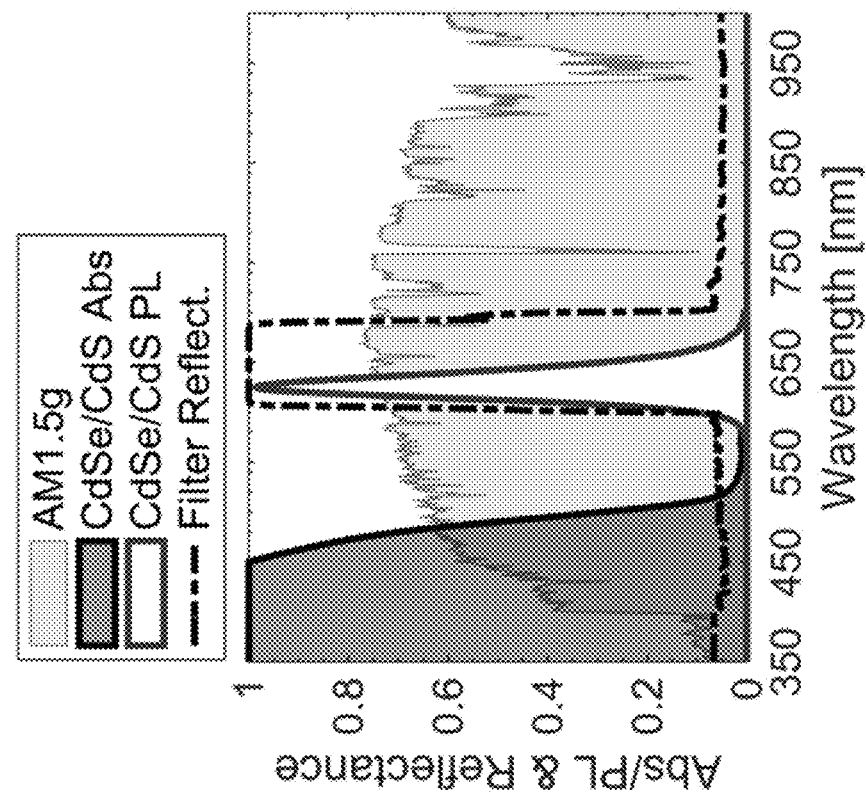
FIGS. 3A and 3B show measured Si and InGaP EQE curves with respect to wavelength and the absorption and photoluminescence spectra for synthesized and measured CdSe/CdS QDs in accordance with various embodiments of the invention.
Figure 3A:
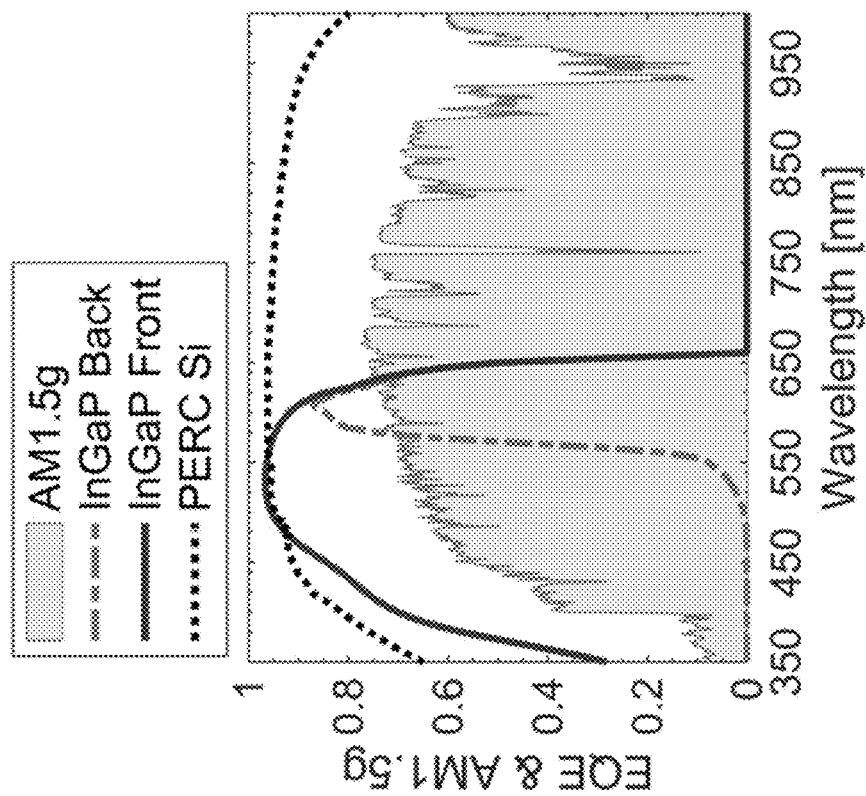
Figure 3C:
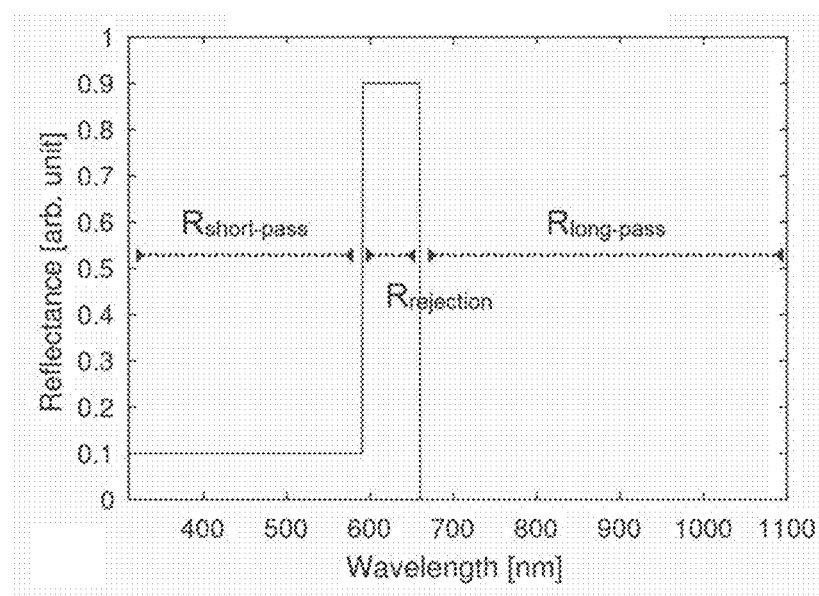
FIG. 3C shows reflectance of an exemplary spectrum dielectric stack filter with respect to wavelength for a given angle of incidence in accordance with an embodiment of the invention.

As shown in FIGS. 1A-1B and 2A-2B, MOTLSCs in accordance with various embodiments of the invention can be constructed with certain materials and components so as to allow for a greater spectral efficiency across the solar spectrum. In many embodiments, the MOTSLC is constructed with a silicon subcell and a polymer waveguide having embedded CdSe/CdS QDs and an array of embedded planar InGaP cells. FIGS. 3A and 3B show measured Si and InGaP EQE curves with respect to wavelength and the absorption and photoluminescence spectra for synthesized and measured CdSe/CdS QDs in accordance with an embodiment of the invention. MOTLSCs can also include filters designed to filter for a specific range of wavelengths. FIG. 3C shows reflectance of an exemplary spectrum dielectric stack filter with respect to wavelength for a given angle of incidence in accordance with an embodiment of the invention. In the illustrative filter, there is high reflectivity in the rejection band ($R_{rejection}$) and low reflectivity in the out of band ($R_{short-pass}$, $R_{long-pass}$). In the illustrative embodiment, $R_{short-pass}$, $R_{rejection}$, and $R_{long-pass}$ correspond to the short-wavelength (300 to 585 nm), mid-wavelength (585 to 665 nm), and long-wavelength (665 to 1100 nm) reflection regimes, respectively.

Performance Modeling of MOTLSCs

A tandem LSC-Si module design in accordance with various embodiments of the invention can be characterized through the use of a Monte Carlo ray tracing model. The algorithm traces photons throughout the module architecture. Photon trajectories can be determined via scattering, reflection, transmission, and absorption probabilities for each component in the device. Photon reflection probabilities can be calculated by Fresnel laws for the transverse-electric ("TE") and transverse-magnetic ("TM") polarizations, and refraction angles can be calculated via Snell's law. The algorithm assumes either complete transmission or reflection at a given interface, thereby stochastically treating photon paths. To achieve sufficient statistical averaging, approximately $1 \times 10^6$ photons were initialized for a given Monte Carlo simulation. To simulate low DNI environments, 40% of incident photons are assumed to normally strike the tandem module and 60% are assumed to approach with angles uniformly distributed throughout the incident photon hemisphere. Cosine factor intensity losses apply to all initialized photons, and the net incident power were determined.

Figure 4:
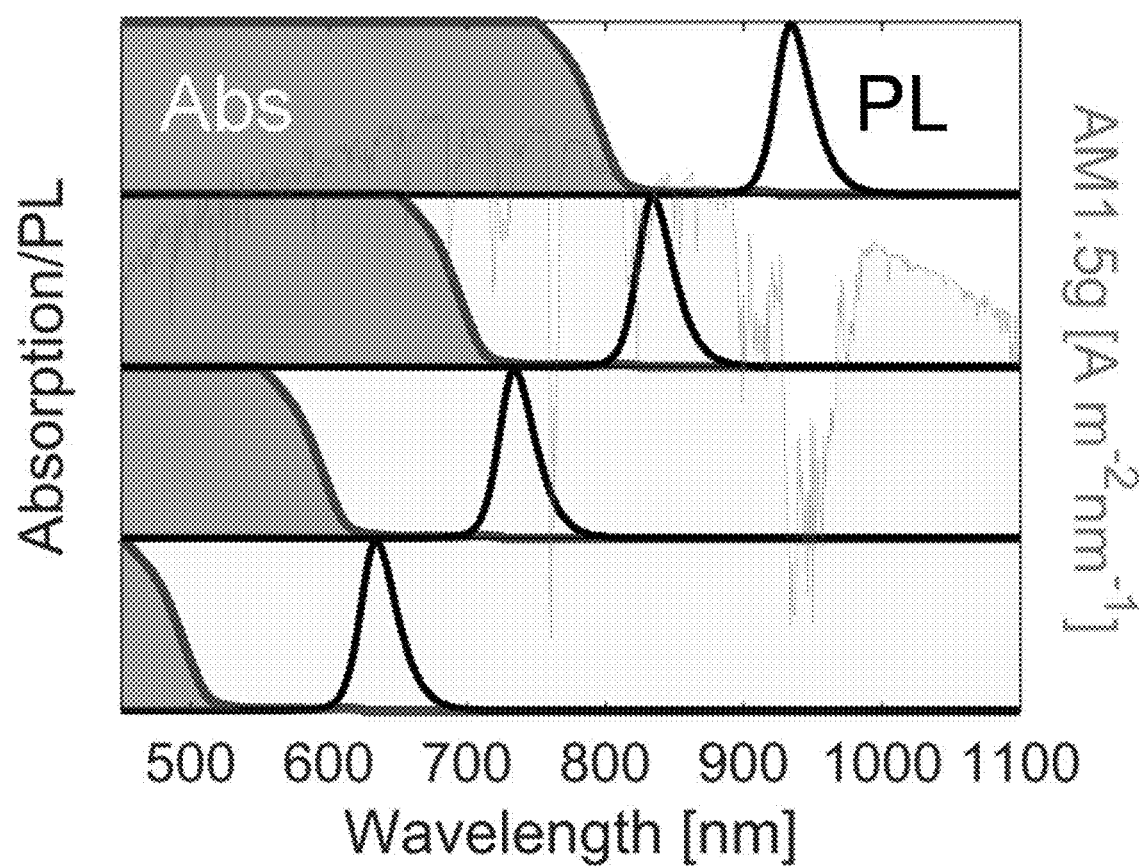
FIG. 4 conceptually illustrates the absorption and PL spectra for varying red-shifted luminophores in accordance with an embodiment of the invention.

For the cases with and without a selective mirror, photons impinge upon either the top filter or the LSC waveguide, respectively. For this model, a PLMA polymer waveguide (refractive index n=1.44) with uniformly distributed QDs was used for simulations. Given a certain optical loading of QDs within the PLMA, QD absorption within the polymer can be determined using the Beer-Lambert law. Experimentally synthesized CdSe/CdS QDs' absorption and PL characteristics can be entered as a baseline for Monte Carlo optimization. As can readily be appreciated, while this analysis assumes PLMA and the CdSe/CdS as the respective materials for the polymer waveguide and the embedded luminophores, other suitable materials for the waveguide (e.g., PMMA, PDMS, and EVA) and the luminophores (e.g., InP QDs, Si QDs, and nanorods) can be used in practical applications. For instance, the effects of red-shifted absorption and PL bands on the overall module efficiencies of the tandem LSC/Si device can be modeled. FIG. 4 conceptually illustrates the absorption and PL spectra for varying red-shifted luminophores, assuming a constant PL distribution and absorption feature. Furthermore, possible luminophore features such as non-isotropic emission of the radiated light (either by direct QD manipulation and non-uniformity or by metasurface/photonic crystal/plasmonic antenna resonator coupling to the isotropic luminophore radiation) can be included. This can engender an anisotropic distribution of radiated light from the embedded luminophores.

The heterojunction structure of the CdSe/CdS core/shell QDs can allow for fine-tuning of the absorption and photoluminescence spectra. Luminophores exhibiting large Stokes shifts at high PLQY can minimize both the number of photons parasitically absorbed by the QDs as well as the amount of light transmitted through the escape cone of the waveguide. Steady-state absorption spectra can be collected using a Shimadzu UV-3600 double beam spectrometer, and steady state PL spectra can be collected via a Horiba Jobin-Yvon FluoroLog 2 spectrofluorometer. For the Monte Carlo simulation, the PLQY can be defined as the probability of photon re-emission directly after absorption by a QD.

In order to account for secondary effects, such as polymer non-radiative absorption and photon scattering, PLMA waveguides of corresponding thicknesses can be engineered for direct measurement and use in the Monte Carlo. Luminescent waveguides can be fabricated via the UV polymerization method. The monomer lauryl methacrylate (Sigma Aldrich) and the cross-linker ethylene glycol dimethacrylate (Sigma Aldrich) can be mixed at a 10:1 volume ratio, and the CdSe/CdS quantum dots can be dispersed in hexane solution. To control film thickness, 0.05 vol % photo-initiator Darocur 1173 (Sigma Aldrich) can be introduced into solution, where the photo-initiator can be filled through capillary action between two quartz plates with soda lime glass spacers at the corners. Finally, the assembled device can polymerize under UV illumination and inert atmosphere for approximately 30 minutes. The top quartz plate can then be removed. Waveguide absorption can be measured using a Varian Cary 5G spectrophotometer.

Once a photon strikes either the embedded InGaP microcell or the Si subcell, the measured EQE can determine the photon to electron conversion. Upright InGaP solar cells with a thin emitter can be grown by metal organic vapor phase epitaxy. Microcells can be processed and placed on glass using transfer printing techniques. An angle-averaged EQE can be calculated for the InGaP device when embedded in PLMA with a ZnS anti-reflective coating ("ARC"). An EQE curve from measurements (and fitting) of larger InGaP devices in air can be calculated without an ARC.

For the Si subcell, an advanced design suitable for reaching high efficiencies, specifically an interdigitated back passivated contact cell, can be utilized. This back contacted architecture can free the cell of optical shading losses. Passivated contacts can enable high open circuit voltages. The cell can be fabricated from 180 μm thick n-type Cz wafer with a resistivity of 3 Ω-cm. Wafer saw damage can be removed by etching and KOH. The wafers can be RCA cleaned, and a rear tunneling oxide can be formed at 700° C. with $O_2$ flow. Approximately 100 nm of intrinsic amorphous Si can be deposited on the rear side by plasma-enhanced chemical vapor deposition. Beamline ion implantation at 5 kV can be used to implant $4 \times 10^{15}$ cm$^{-2}$ B for the rear emitter regions using photolithographic masking to define the area of the device that is implanted. Similarly, beamline ion implantation can be used to implant $7 \times 10^{15}$ cm$^{-2}$ P for the rear BSF regions. The sample can be annealed at 850° C. to crystallize the amorphous Si and activate the implanted dopants. Approximately 15 nm of $Al_2O_3$ can be deposited on the entire surface of the device by atomic layer deposition ("ALD"), and approximately 75 nm SiNx can be deposited on the front side as an anti-reflection coating. The sample can be annealed at 400° C. in forming gas to activate hydrogen passivation of its surfaces. The $Al_2O_3$ can be etched from the rear of the sample, and an interdigitated pattern can be defined photolithographically and then metalized by evaporating 1 μm Al. The cell EQE can be measured using an Oriel QE system.

To simulate photon reflection via front contact shading, a finite probability can be assigned to the InGaP cell. In one embodiment, the Monte Carlo simulation for a fabricated Si cell EQE yielded an overall PCE of $\eta_{Si} \approx 21.8\%$ for the stand-alone Si subcell under direct illumination.

Photon loss mechanisms in MOTLSCs in accordance with various embodiments of the invention can occur from either initial reflection off the top mirror of the module, parasitic absorption via the QDs, or transmission through the top surface of the device. A count of the photons and their incident wavelength accepted by either the InGaP or Si cell can be integrated with respect to the standard AM1.5G spectrum. The model can then use a detailed balance calculation of the open circuit voltage ($V_{oc}$) and fill factor (FF) to give an overall tandem LSC-Si module efficiency. An ideality factor of n=1 is assumed for both the InGaP and Si cell cases, and the ideal diode equation can be applied to determine the $V_{oc}$ and FF, given as:

$$V_{OC} = \frac{nk_BT}{q}\ln\left(\frac{I_L}{I_0}\right) + \frac{nk_BT}{q}\ln(Q_{ERE})$$

where q is the electron charge, $k_B$ is the Boltzmann constant, T is the cell operating temperature (assumed to be T=300K), $I_L$ is the simulated illumination current, and $I_0$ is the dark saturation current. $I_0$ is approximated based on the radiative limit of the cell, which can be determined from the measured energy bandgaps ($E_g$) of the fabricated InGaP and Si cells:

$$I_0 = \frac{q}{k_B}\frac{q15\sigma}{\pi^4}A_{wg}T^3\int_{E_g/k_BT}^{\infty}\frac{x^2}{e^x-1}dx$$

where σ is the Stefan-Boltzmann constant and $A_{wg}$ is the waveguide area. This simulation assumes a GG of 100, where the fabricated InGaP micro-cell dimensions were measured to be $1.5 \times 10^{-3}$ m by $1 \times 10^{-4}$ m, yielding an InGaP cell area of 0.15 mm$^2$ and therefore a waveguide area of 15 mm$^2$.

Tandem LSC-Si devices in accordance with various embodiments of the invention can include a large number of module components. Given this large parameter space, an extensive multi-parameter sweep can be performed while assuming no top or bottom mirrors in the device architecture. As a first step, the QD PL peak location, the QD PL full width at half maximum ("FWHM"), the optical density ("OD") of QDs within the PLMA waveguide, and the QD PLQY can be varied. FIG. 5A-5D show the results of these parametric variations.

Figure 5A:
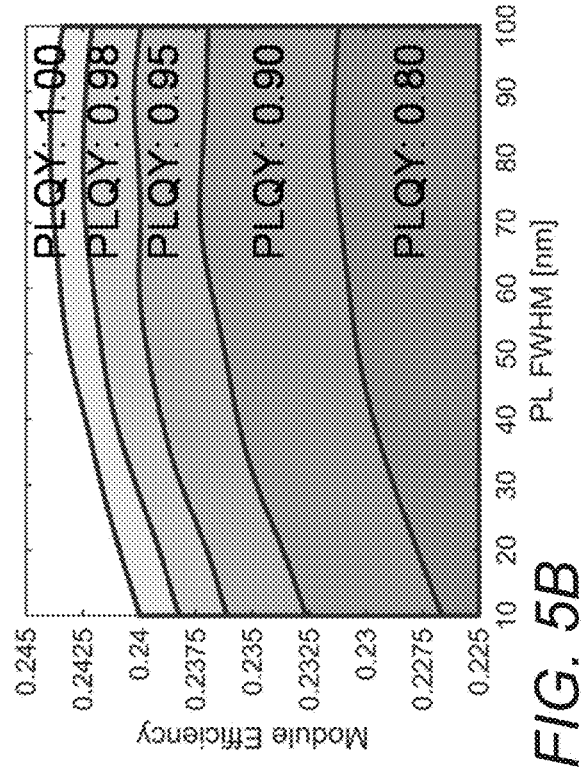
FIGS. 5A-5D show tandem LSC-Si module efficiency in the case without mirrors in accordance with various embodiments of the invention.
Figure 5B:
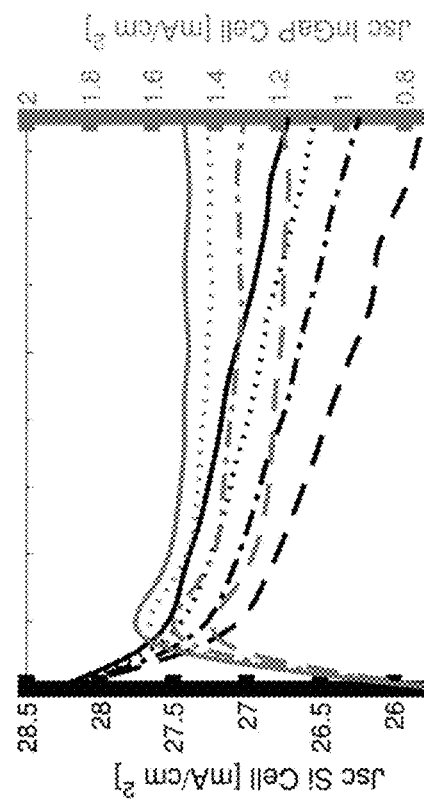

As shown in FIG. 5A, in the case without mirrors, the ideal PL peak location obtains a maximum module performance slightly above 650 nm across all PLQY values. This results from a Stokes shift increase, minimizing re-absorption loss at wavelengths with high InGaP EQE. An optimum FWHM for the QD PL was observed, at approximately 80 nm, as shown in FIG. 5B. With a larger FWHM of the QD PL, increased photon spread yields more frequent opportunities for radiated photons to be absorbed by either the more efficient InGaP micro-cell or the higher EQE Si subcell. In contrast, when the FWHM spreads too far, non-radiative recombination via QDs' re-absorption can decrease the overall module efficiency.

Figure 5C:
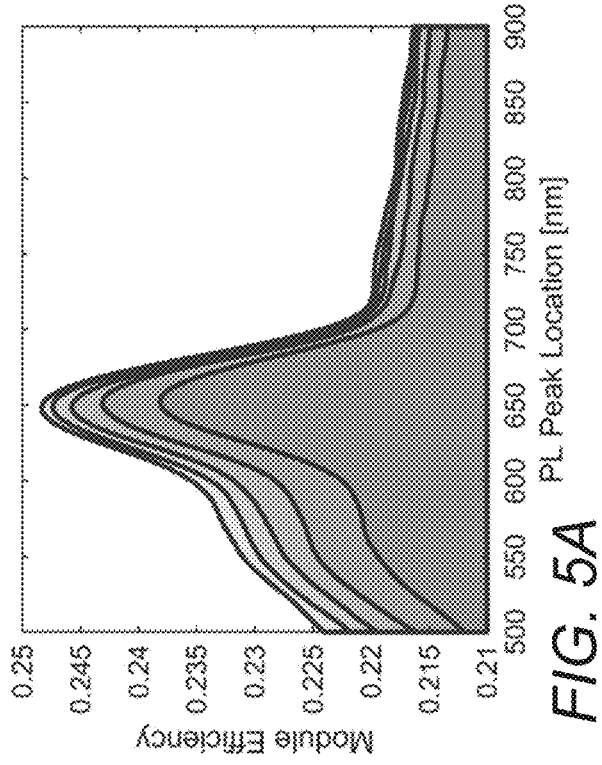

Across all PLQY values, maximum PCE occurs at an OD of 0.30 at 450 nm, as shown in FIG. 5C. For OD values less than 0.30, QDs do not absorb and re-direct enough photons to the InGaP micro-cells. However, for OD values greater than 0.30, photons are either parasitically absorbed by the QDs or re-radiated at angles within the escape cone at a greater frequency. With unity PLQY, optimized PL peak location, ideal FWHM, and intermediate waveguide OD, a maximum PCE of $\eta=26.6\%$ can be achieved.

Figure 5D:
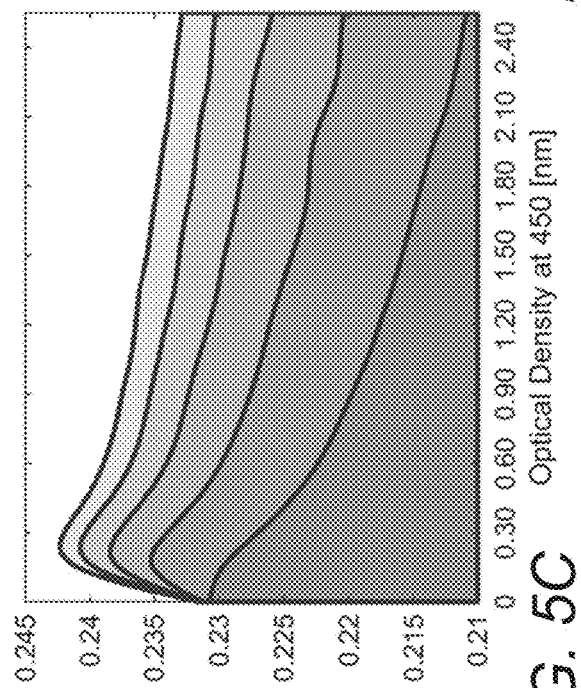

In the case without mirrors, the majority of output power generated by the tandem LSC-Si module comes from the Si subcell. As shown in FIG. 5D, the generated photocurrent of the Si cell was found to be an order of magnitude greater than the InGaP cell photocurrent across all PLQY. Even at unity PLQY, escape cone loss prevents higher concentration of light impinging upon the InGaP cell. Therefore, in order to achieve both higher overall module efficiencies and more significant InGaP cell power generation, additional light-trapping mechanisms should be integrated into the device architecture.

To determine optimal spectral and angular requirements for the top and bottom PL trapping mirrors, the mirror reflection parameters can be varied with a top-hat like profile as shown in FIG. 3C. The top mirror can impose more stringent spectral requirements. The optical filter can require near unity short-pass response as QD absorption typically occurs only in this spectrum. Similarly, the long-pass response should be ideal in order for light to reach the Si subcell. In contrast, the bottom mirror short-passed light is often parasitically absorbed by the Si subcell. Short-pass requirements for the bottom mirror can be relaxed. However, both the top and bottom mirrors can require maximum light reflection in the rejection-band in order to trap photons exiting the optical waveguide through the escape cone.

Synthesized CdSe/CdS QDs in accordance with various embodiments of the invention exhibit FWHM of approximately 30 nm with a PL peak location centered at 625 nm. These measured values were treated as fixed within the mirror optimization simulations. Given this PL spectra, FIG. 6A shows the module PCE for varying rejection-band widths, centered at 625 nm. In the illustrative embodiment, a width of 68 nm yielded maximum device performance. The rejection-band mirror reflection width therefore captures enough of the QDs' radiated photons without preventing incident light to reach either the embedded QDs or the underlying Si cell. Assuming ideal rejection-band top/bottom mirror widths, the effect of $R_{rejection}$ against $R_{pass}$ (the short and long pass regimes) can be investigated where angular independent response is assumed. FIG. 6C details the overall module efficiency results, varying these two reflection parameters. While optimal module efficiency can result from unity $R_{rejection}$ reflection and zero $R_{pass}$, increased mirror $R_{pass}$ is most detrimental to overall device performance. Assuming no top/bottom mirror parity, the overall module efficiency impact due to varying $R_{short-pass}$ of only the bottom mirror can be determined while assuming unity $R_{rejection}$ and zero $R_{pass}$ for the top mirror. FIG. 6D shows that, as predicted, short-wavelength transmission requirements for the bottom mirror are significantly reduced in order to obtain high performance. With optimized top and bottom, angularly-independent mirrors from these results, an overall module efficiency of $\eta=27.75\%$ can be achieved.

As is the case with common spectrally-selective filters (e.g., dielectric stacks), a greater incident photon angle often blueshifts the rejection-band of the mirror while maintaining a relatively constant width. Simulations varying the rejection-band left and right edges' location for normally incident photons can be conducted. A rejection-band center shift of 1 nm per degree off normal incidence can be assumed. FIG. 6B shows the results of this simulation. For rejection-band left edges located near 620 nm and right edges near 700 nm, a global maximum module efficiency can be determined. For rejection-band widths too large, module efficiency decreases as more of the band's reflection fails to overlap with the PL spectra and reflects incident light. However, this global maximum occurs at rejection-band widths that, at normal incidence, are further red-shifted. This result implies that the top and bottom mirrors' fundamental contribution to tandem LSC-Si module efficiency comes from reflecting back photons with large angles of incidence within the waveguide.

Analogous to the optimization of the device without mirrors, the maximum module efficiency possible with ideal top and bottom mirrors can be determined. FIG. 7A shows that ideal PL peak values depend strongly on the PLQY. For lower QD performance, 650 nm yields maximum module efficiency. Parasitic absorption dominates photon recycling events for poor PLQY values. With optimized top/bottom mirrors, photon thermalization odds increase for PL peaks centered in the mirrors' rejection-band. However, as the limit of PLQY approaches unity, the PL peak optimum shifts to 625 nm. Because top/bottom mirror rejection-band reflection is lossless and centered at 625 nm, unity PLQY results in zero instances of non-radiative absorption by the embedded QDs, and therefore allows for unlimited recycling and trapping of short-wavelength photons.

Similarly, a strong dependence on PLQY in the module performance can be seen by varying the FWHM, as shown in FIG. 7B. As expected, high PLQY values favor sharply-peaked PL. High PLQY minimizes non-radiative photon recycling, and therefore narrower FWHM values allow for more photon capture.

Varied optical density of the QDs embedded within the polymer waveguide for the perfect top/bottom mirror case additionally shows this strong dependence on PLQY values, as shown in FIG. 7C. However, in all cases of module PCE, a maximum can be obtained at OD of 0.30 at 450 nm. In contrast to the no-mirror case, the module efficiency curves for non-unity PLQY decrease less rapidly for increasing OD. With increased QD absorption and PL, there is more opportunity for escape-cone losses. However, for ideal mirrors, unity rejection-band redirects all such potential escaped photons back into the waveguide. With unity PLQY, optimized QD PL peak location, ideal FWHM, and an OD of 0.30 at 450 nm, a maximum PCE of $\eta=31.1\%$ can be achieved, approximately a 4.5% boost from the no-mirrors case.

In the perfect-mirrors case, the output power generated by this tandem LSC-Si module is much more evenly split between the Si subcell and the embedded InGaP micro-cell. The InGaP contributes approximately 43% of the total output power for unity PLQY. FIG. 7D displays the short circuit current contribution of the InGaP cell. In contrast to FIG. 5D, the InGaP photocurrent has increased by a factor of 4.5.

The fraction of DNI light affecting the overall module PCE can be investigated. FIG. 8A shows the results of this simulation for the perfect-mirror architecture. As expected, the highest module efficiency results from 100% DNI; however, the absolute percent efficiency increase between the completely diffuse case (i.e., 0% DNI) and the fully direct case is 0.389% overall PCE. This suggests that, while DNI light is ideal for maximum module efficiencies, the tandem LSC-Si architecture can perform with greater than 30% PCE even in the completely diffuse limit.

Figure 8B:
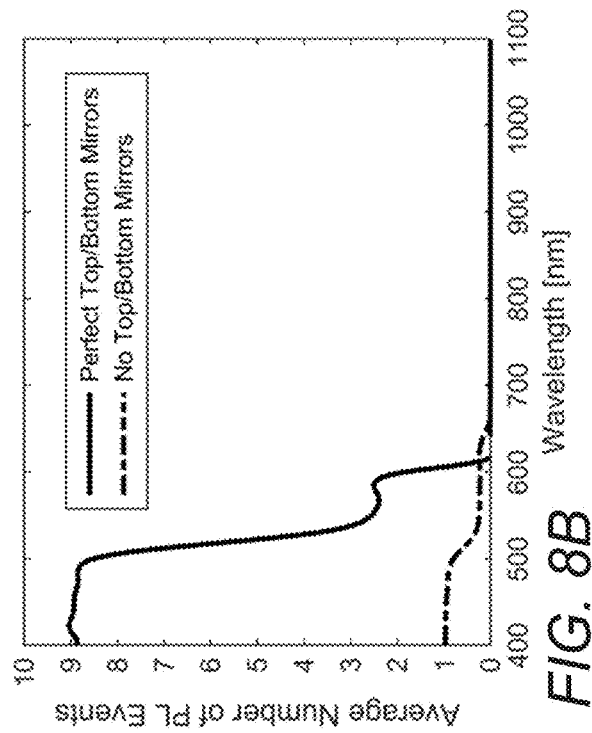
FIGS. 8B-8D show performance analysis of best-case scenarios from both the no-mirror and perfect-mirror cases in accordance with various embodiments of the invention.
Figure 8D:
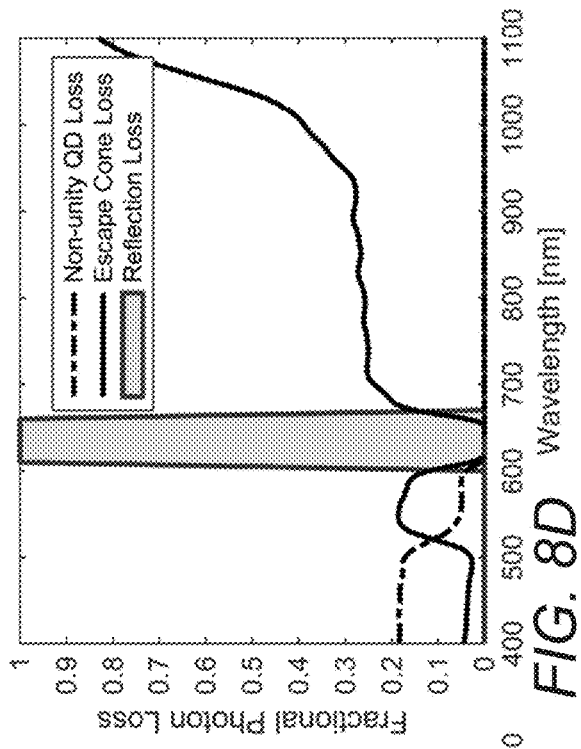
Figure 8A:
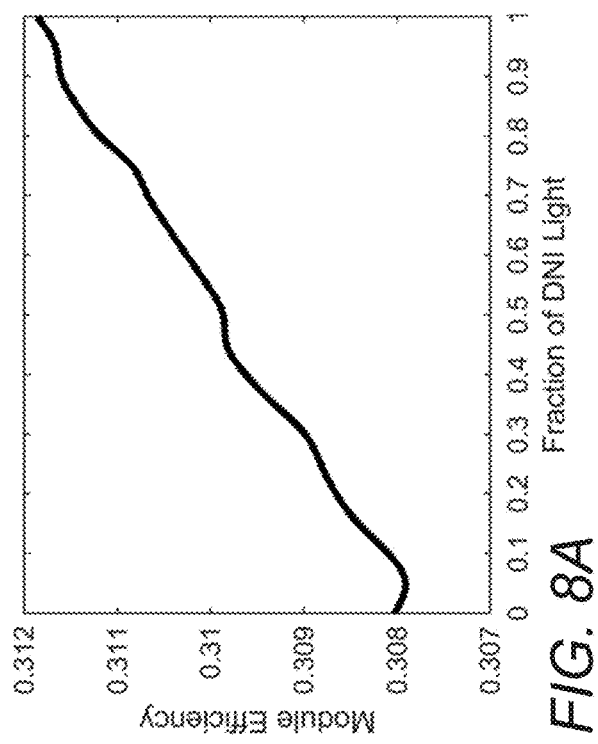
FIG. 8A shows tandem LSC-Si module efficiency with varying fractions of light that is normally incident upon the structure in accordance with an embodiment of the invention.
Figure 8C:
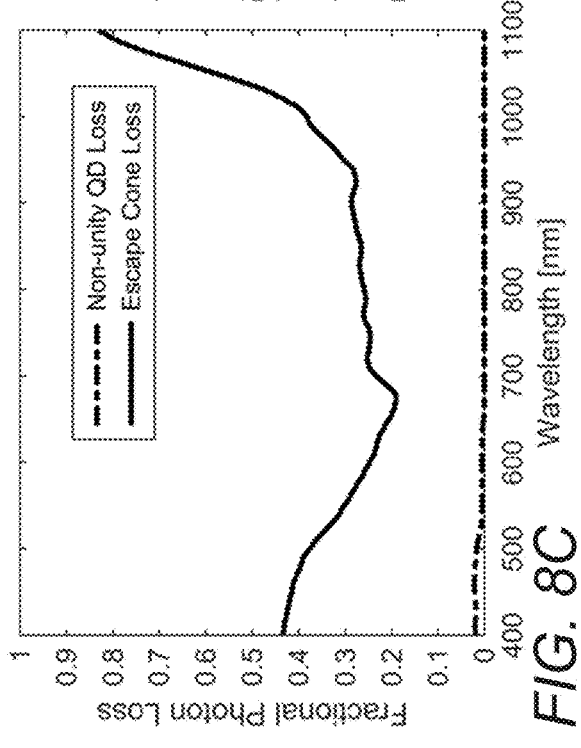

FIGS. 8B-8D show performance analysis of best-case scenarios from both the no-mirror and perfect-mirror cases. For this, non-unity PLQY of 0.98 was chosen to determine how parasitic QD absorption loss compares to escape cone loss. In the no-mirror case, the dominate performance detriment comes from escape cone loss, shown in FIG. 8C. Escape cone loss stems from non-unity Si EQE and incomplete waveguide trapping. For the perfect mirror case, short-wavelength photons are more likely parasitically absorbed as a result of increased photon recycling, shown in FIG. 8D. This can be demonstrated by comparing the average number of PL events for a given photon of a certain wavelength, shown in FIG. 8B. Long-wavelength photons' loss mechanism for the perfect mirror case is primarily a result of imperfect absorption of the Si subcell, matching the no mirror case. Table 1 shows the comparison between best-case scenarios of the no-mirror and perfect-mirror configuration for unity and 0.98 PLQY. Additionally, Table 1 compares the overall power output with the use of a 25.6% cell efficiency, silicon heterojunction structure with interdigitated back contacts as the subcell. The power output possible with the tandem LSC-Si architecture can be demonstrated by replacing the subcell with a passivated emitter and rear cell ("PERC").

As shown, significant PCE enhancements to both traditional LSC designs and flat-plate Si cells via a tandem LSC-Si module with spectrally-selective top and bottom mirrors and CdSe/CdS QD luminophores with optimally tuned absorption and PL spectra can be achieved. The application of a Monte Carlo ray-tracing model to fabricated Si and InGaP cells with measured EQEs yielded cell efficiencies of $\eta Si=21.8\%$ and $\eta InGaP=24.9\%$ under full DNI. Under low DNI conditions, maximum LSC-Si PCEs reaching 26.6% and 31.1% for the no-mirrors and perfect-mirrors cases can be achieved, respectively. Furthermore, assuming subcell EQEs of a PERC or a HIT Si cell, tandem LSC-SI PCEs can achieve 32.2% and 32.9%, respectively.

Assuming a tandem structure without top and bottom mirrors, an ideal QD PL peak location of 650 nm given the InGaP and Si cell EQEs, optimized QD PL FWHM of 80 nm, and an OD of the embedded QDs within the PLMA waveguide of 0.30 at 450 nm can be shown. For high QD PLQY under these conditions, a maximum PCE of 26.6% can be shown where roughly 20% of this power is generated by the LSC and 80% by the Si subcell.

Optimizing the top and bottom mirrors' spectral reflection and angular dependence for maximum PCE, an ideal QD PL peak location of 625 nm, optimized QD PL FWHM of 10 nm, and an OD of the embedded QDs within the PLMA waveguide of 0.30 at 450 nm can be shown for near-unity PLQY. Under these conditions and optimized mirror design, a maximum PCE of 31.1% can be shown where roughly 45% of the output power is generated by the LSC and 55% by the Si subcell. These modeling results demonstrate the efficiency amplifications possible, even under low DNI conditions, by the tandem architecture in accordance with various embodiments of the invention.

While the above description contains many specific embodiments of the invention, these should not be construed as limitations on the scope of the invention, but rather as an example of one embodiment thereof. It is therefore to be understood that the present invention may be practiced in ways other than specifically described, without departing from the scope and spirit of the present invention. Thus, embodiments of the present invention should be considered in all respects as illustrative and not restrictive. Accordingly, the scope of the invention should be determined not by the embodiments illustrated, but by the appended claims and their equivalents.

What is claimed is:

1. A luminescent solar concentrator comprising:
   a waveguide configured to trap light incident on a first surface via total internal reflection, the waveguide comprising:
      embedded luminophores configured to absorb at least a portion of trapped light and emit photoluminesced light; and
      at least one embedded planar cell disposed on a second surface opposite the first surface, the at least one embedded planar cell configured to absorb and convert at least a portion of the photoluminesced light to an electric signal;
   a subcell configured to absorb and convert the at least portion of the trapped light and the at least the portion of the photoluminesced light to the electric signal; and
   a first selectively-reflective mirror and a second selectively-reflective mirror configured to filter light of specific wavelengths, wherein:
      the first selectively-reflective mirror is configured to filter light before such that passed light is incident on the waveguide; and
      the second selectively-reflective mirror is disposed between the waveguide and the subcell.

2. The luminescent solar concentrator of claim 1, wherein the subcell comprises a silicon subcell.

3. The luminescent solar concentrator of claim 1, further comprising a plurality of glass slides.

4. The luminescent solar concentrator of claim 3, wherein the luminescent solar concentrator is constructed with an air gap between the waveguide and the first selectively-reflective mirror.

5. The luminescent solar concentrator of claim 4, wherein the luminescent solar concentrator is constructed with an air gap between the waveguide and the second selectively-reflective mirror.

6. The luminescent solar concentrator of claim 1, wherein at least one of the first selectively-reflective mirror and the second selectively-reflective mirror comprises a structure selected from the group consisting of a metasurface mirror, a polymeric stack filter, a Bragg grating, and a dielectric stack.

7. The luminescent solar concentrator of claim 1, wherein at least one of the first selectively-reflective mirror and the second selectively-reflective mirror comprises a high contrast grating metasurface mirror.

8. The luminescent solar concentrator of claim 7, wherein the high contrast grating metasurface mirror comprises a hexagonal array of AlSb cylindrical pillars patterned on a glass substrate.

9. The luminescent solar concentrator of claim 8, wherein the hexagonal array of AlSb cylindrical pillars has a pitch of about 475-515 nm and the AlSb cylindrical pillars have thicknesses of about 85-125 nm and radii of about 80-120 nm.

10. The luminescent solar concentrator of claim 1, wherein the first selectively-reflective mirror comprises a high contrast grating metasurface mirror and the second selectively-reflective mirror comprises a dielectric stack.

11. The luminescent solar concentrator of claim 1, wherein the at least one embedded planar cell comprises a cell selected from the group consisting of an InGaP cell and a GaAs cell.

12. The luminescent solar concentrator of claim 11, wherein the at least one embedded planar cell comprises an array of embedded planar cells.

13. The luminescent solar concentrator of claim 11, wherein the at least one embedded planar cell comprises a bifacial cell.

14. The luminescent solar concentrator of claim 1, wherein the waveguide comprises a polylaurylmethacrylate.

15. The luminescent solar concentrator of claim 1, wherein the waveguide comprises a material selected from the group consisting of polymethyl methacrylate, polydimethylsiloxane, and ethylene-vinyl acetate.

16. The luminescent solar concentrator of claim 1, wherein the embedded luminophores comprise CdSe/CdS quantum dots.

17. The luminescent solar concentrator of claim 1, wherein the embedded luminophores comprise luminophores selected from the group consisting of InP quantum dots, Si quantum dots, and nanorods.

18. The luminescent solar concentrator of claim 1, wherein the emitted photoluminesced light is of a longer wavelength than the trapped light absorbed by the embedded luminophores.

* * * * *